(12) United States Patent
Kobane et al.

(10) Patent No.: US 7,339,310 B2
(45) Date of Patent: Mar. 4, 2008

(54) LAMINATED PIEZOELECTRIC ELEMENT

(75) Inventors: Yoichi Kobane, Kuwana (JP); Hiroaki Asano, Yokkaichi (JP); Hidekazu Hattori, Nagoya (JP)

(73) Assignee: Denso Corporation (JP)

( * ) Notice: Subject to any disclaimer, the term of this patent is extended or adjusted under 35 U.S.C. 154(b) by 0 days.

(21) Appl. No.: 11/405,520

(22) Filed: Apr. 18, 2006

(65) Prior Publication Data

US 2006/0232173 A1    Oct. 19, 2006

(30) Foreign Application Priority Data

Apr. 18, 2005   (JP)   ............................. 2005-120387

(51) Int. Cl.
*H01L 41/047* (2006.01)
(52) U.S. Cl. ...................................... 310/366
(58) Field of Classification Search ......... 310/363–366
See application file for complete search history.

(56) References Cited

U.S. PATENT DOCUMENTS

| | | | | |
|---|---|---|---|---|
| 5,438,232 A | * | 8/1995 | Inoue et al. | ............... 310/328 |
| 6,495,946 B1 | * | 12/2002 | Heinz et al. | ............... 310/328 |
| 2001/0026114 A1 | * | 10/2001 | Takao et al. | ............... 310/364 |
| 2001/0047796 A1 | | 12/2001 | Yamada et al. | |

FOREIGN PATENT DOCUMENTS

| | | |
|---|---|---|
| JP | 8-242025 | 9/1996 |
| JP | 2001-148521 | 5/2001 |
| JP | 2001-345490 | 12/2001 |
| JP | 2002-61551 | 2/2002 |

* cited by examiner

*Primary Examiner*—Thomas M. Dougherty
(74) *Attorney, Agent, or Firm*—Nixon & Vanderhye PC

(57) ABSTRACT

A laminated piezoelectric element (1) comprises a laminated piezoelectric element (1) piezoelectric layers (11) composed of a ceramic capable of expanding and contracting upon application of a voltage, and internal electrode layers (21a and 21b) that supply voltage to the piezoelectric layers, the internal electrode layers and piezoelectric layers being alternately provided, a first external electrode layer (31) provided on a side of the laminated piezoelectric element (1) and electrically connected with the internal electrode layers (21a and 21b), and a second external electrode layer (32) provided on a side of the laminated piezoelectric element (1) and electrically connected with the internal electrode layers (21a and 21b) via the first ecternal electrode layer wherein there are specific external electrode width relationships.

20 Claims, 17 Drawing Sheets

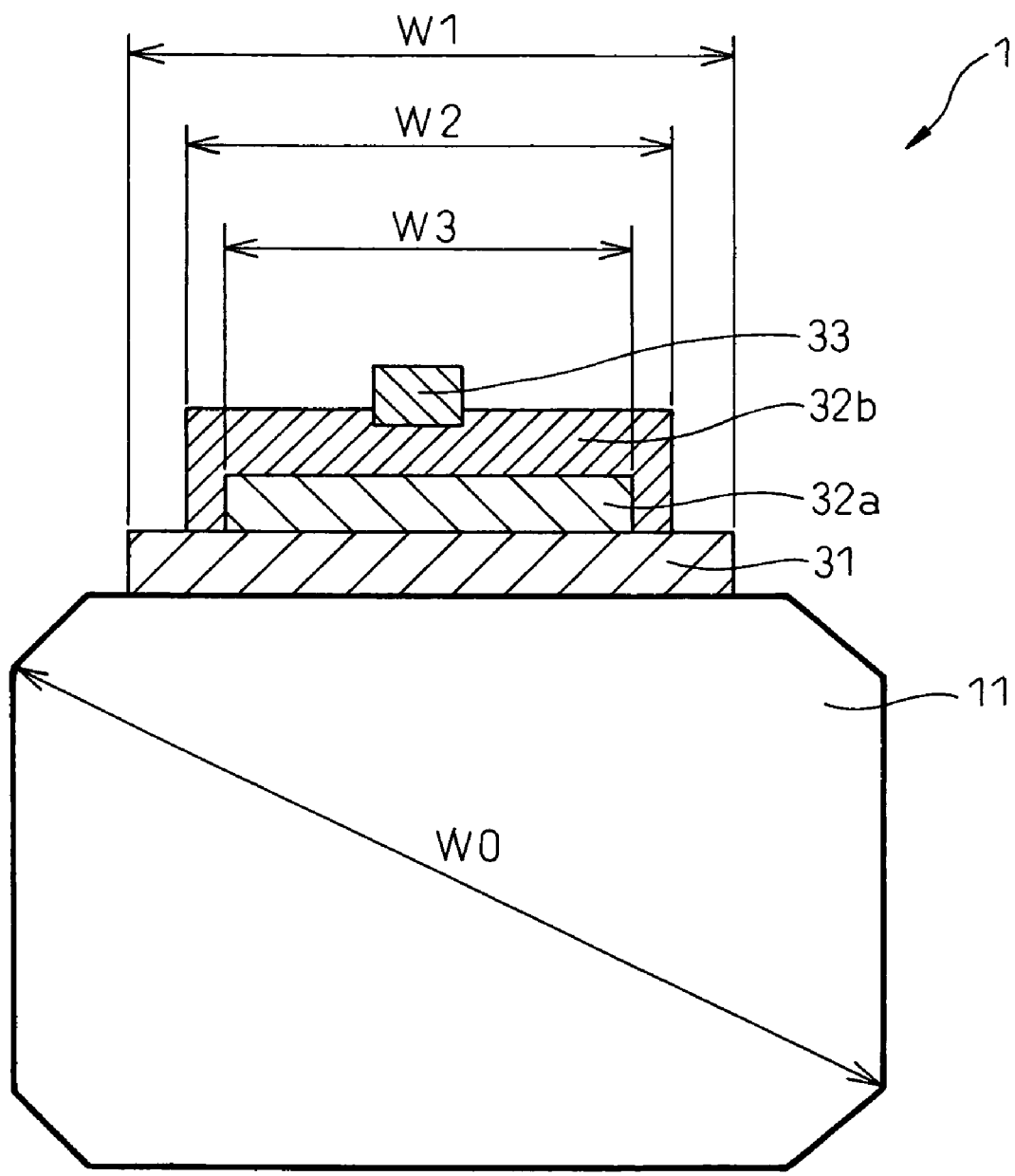

LAMINATED PIEZOELECTRIC ELEMENT

BACKGROUND OF THE INVENTION

1. Field of the Invention

The present invention relates to a laminated piezoelectric element used in, for example, an automobile fuel injection valve, a precision positioning apparatus of an optical apparatus, a driving element for prevention of vibration or an ink jet printer, and so forth.

2. Description of Related Art

Laminated piezoelectric elements, and particularly laminated piezoelectric elements used in automobile fuel injection valves, are required to ensure reliability over a broad temperature range extending from low temperatures to high temperatures. In environments in which they are subjected to such thermal shock, differences in thermal expansion between the piezoelectric element and external electrode provided on a side of the piezoelectric element cause thermal stress to be applied from the external electrode to the piezoelectric element resulting in the problem of the formation of cracks in the external electrode and the piezoelectric element.

Japanese Unexamined Patent Publications (Kokai) No. 2001-345490 and No. 8-242025 propose a laminated piezoelectric element that improves the durability of the external electrode by providing a plurality of external electrodes having different elongation percentages on a side of the piezoelectric element. In addition, Japanese Unexamined Patent Publication (Kokai) No. 2001-148521 proposes a laminated piezoelectric element that provides an external electrode on a side of the piezoelectric element, a solder layer that is narrower than the external electrode on the external electrode, and an external electrode layer connection lead wire that electrically connects the external electrode on the solder layer. As a result, thermal stress attributable to the difference in thermal expansion between the solder layer and piezoelectric element is not applied directly to the piezoelectric element due to the external electrode being wider than the solder layer.

However, the prior art described in JPP'490 is susceptible to concentration of thermal stress generated in both ends of the external electrodes as the widths of the plurality of external electrodes are the same and, as the thermal stress applied to the piezoelectric element from the external electrodes is large, there was the problem of cracks forming in the external electrodes and piezoelectric element. In addition, in the prior art described in JPP'521, as a solder layer is provided discontinuously relative to the direction of lamination of the piezoelectric, if cracks form at a plurality of locations in the external electrode not in contact with the solder layer due to the difference in thermal expansion between the solder layer and external electrode, sections appear in which there are electrical discontinuities between the locations where cracks have formed. In addition, if the cracks that have formed in the piezoelectric extend to the external electrode not in contact with the solder layer as well, sections similarly appear in which there are electrical discontinuities between the locations where cracks have formed. As a result, as a voltage cannot be applied to a portion of the piezoelectric element and the displacement of the piezoelectric element decreases, there is the problem that the characteristics change during the course of use. In addition, thermal stress is applied to the external electrode and piezoelectric element from both ends of the solder layer in the direction of lamination of the piezoelectric, resulting in the formation of cracks in the piezoelectric element. As the sites where cracks form are piezoelectric active sections and the direction in which the cracks spread is the direction of expansion and contraction of the piezoelectric element, the spreading of the cracks is promoted, thereby resulting in problems in terms of reliability.

SUMMARY OF THE INVENTION

An object of the present invention is to provide a laminated piezoelectric element capable of inhibiting the formation of cracks in an external electrode and piezoelectric element.

This and other objects of the present invention will be easily understood from the following detailed descriptions of the present invention.

In a first aspect of the present invention, a laminated piezoelectric element is provided that is provided with: a laminated piezoelectric element comprising piezoelectric layers composed of a ceramic capable of expanding and contracting upon application of a voltage, and internal electrode layers that supply voltage to the piezoelectric layers, the internal electrode layers and piezoelectric layers being alternately provided; a first external electrode layer provided on a side of the laminated piezoelectric element and electrically connected with the internal electrode layers; and, a second external electrode layer provided on a side of the laminated piezoelectric element and electrically connected with the internal electrode layers via the first external electrode layer; wherein, when the maximum width of the laminated piezoelectric element in the direction perpendicular to the direction of lamination is taken to be $W0$, the width of the first external electrode layer is taken to be $W1$, and the width of the second external electrode layer is taken to be $W2$, the relationship exists in which $W1>W2$ and $2.5 \leq (W2/W0) \times 100 \leq 60$, the laminated piezoelectric element has a piezoelectric active section that expands and contracts when a voltage is applied, and the second external electrode layer is provided continuously in the direction of lamination of the piezoelectric layers in the piezoelectric active section.

According to this first aspect of the present invention, as the widths of the first and second external electrode layers are the same, thermal stress generated in both ends of each external electrode layer can be dispersed. In addition, as $W1>W2$, thermal stress generated in the first external electrode layer is not applied directly to the piezoelectric body. In addition, if $(W2/W0) \times 100$ is 2.5 or more, a bonding strength can be secured which is capable of bonding a lead wire or electrode plate connected to the second external electrode layer with the second external electrode layer. In addition, if $(W2/W0) \times 100$ is 60 or less, a the thermal stress on the piezoelectric body can be held to a low level, the formation of cracks can be inhibited. In addition, if the second external electrode layer is provided continuously in the piezoelectric active section in the direction of lamination of the piezoelectric layers, the effect of thermal stress applied to the first external electrode and piezoelectric active section from both ends of the second external electrode layer in the direction of lamination of the piezoelectric body can be minimized. In other words, since both ends of the second external electrode layer in the direction of lamination of the piezoelectric are substantially not located on the piezoelectric active section, even if cracks form, they have little effect on the piezoelectric active section. On the other hand, in the case the second external electrode layer is provided discontinuously in the direction of lamination of the piezoelectric layers in the piezoelectric active section, thermal stress is applied to the first external electrode and the piezoelectric active section from both ends of the second external electrode layer in the direction of lamination of the piezoelectric, resulting in greater susceptibility to the formation of cracks in the piezoelectric active section. As the direction in which the cracks spread is consistent with the direction in which the piezoelectric active section expands and contracts, the spread of cracks is promoted thereby resulting in problems in terms of reliability.

Further, according to the invention, when the maximum width of the laminated piezoelectric element in the direction perpendicular to the direction of lamination is taken to be $W0$ and the width of the second external electrode layer is taken to be $W2$, a relationship should exist in which $5 \leq (W2/W0) \times 100 \leq 30$. In the case $(W2/W0) \times 100$ is less than 5, bonding strength between a lead wire or electrode plate and the first external electrode layer becomes inadequate. In addition, in the case $(W2/W0) \times 100$ exceeds 30, although the formation of cracks is inhibited, continuous effects cannot be adequately obtained.

Furthermore, according to the invention, when the thickness (after curing) of the first external electrode layer is taken to be $T1$ and the thickness (after curing) of the second external electrode layer is taken to be $T2$, a relationship should exist in which $0.05 \leq (T2/T1) \leq 300$. In the case $T2/T1$ exceeds 300, as the thickness of the second external electrode layer is too large relative to the thickness of the first external electrode layer that acts to alleviate stress, its effect as a stress alleviating material becomes low, resulting in the formation of cracks. In addition, if $T2/T1$ is less than 0.05, bonding strength of the lead wire or electrode plate with the second external electrode layer is inadequate.

Moreover, according to the invention, when the thickness (after curing) of the first external electrode layer is taken to be $T1$ and the thickness (after curing) of the second electrode layer is taken to be $T2$, a relationship should exist in which $1 \leq (T2/T1) \leq 35$. In the case where $T2/T1$ exceeds 35, as the thickness of the second external electrode layer is too large relative to the thickness of the first external electrode layer that acts to alleviate stress, its effect as a stress alleviating material becomes low resulting in the formation of cracks. In addition, if $T2/T1$ is less than 1, bonding strength of the lead wire or electrode plate with the second external electrode layer is inadequate.

In addition, according to the invention, when the maximum width of the laminated piezoelectric element in the direction perpendicular to the direction of lamination is taken to be $W0$, it is preferable that $W0 \leq 15$ mm. In the case $W0$ exceeds 15 mm, width $W2$ of the second external electrode layer becomes 9.0 mm or more, and the thermal stress generated in the second external electrode layer exceeds the strength of the piezoelectric layers, thereby resulting in greater susceptibility to the formation of cracks in the piezoelectric.

In addition, according to the invention, if the first external electrode layer is composed of a metal comprising at least one selected from the group consisting of silver, palladium, platinum, copper, gold, nickel, tin, lead, zinc and bismuth as well as an alloy thereof, when the elastic modulus of the first external electrode layer is taken to be $E1$ and the coefficient of linear expansion is taken to be $\alpha 1$, while elastic modulus of the second external electrode layer is taken to be $E2$ and the coefficient of linear expansion is taken to be $\alpha 2$, if solder or an electrically conductive resin material is used for the second external electrode layer, as $E1 \times \alpha 1$ can be made to be smaller than $E2 \times \alpha 2$, the first external electrode layer acts as a buffer layer that alleviates thermal stress in the second external electrode layer, thereby making it possible to alleviate thermal stress applied to the laminated piezoelectric element from the second external electrode layer.

In addition, according to the invention, if the second external electrode layer comprises solder or an electrically conductive resin material, if a lead wire or electrode plate is connected to the second external electrode layer, bonding strength of the lead wire or electrode plate with the second external electrode layer can be increased.

As has been described above, according to a first aspect of the present invention, a laminated piezoelectric element can be provided that realizes both secured bonding strength between a lead wire or electrode plate connected to the second external electrode layer and the second external electrode layer as well as inhibition of crack formation in the piezoelectric body.

In a second aspect of the present invention, a laminated piezoelectric element is provided that is provided with: a laminated piezoelectric element comprising piezoelectric layers composed of a ceramic capable of expanding and contracting upon application of a voltage, and internal electrode layers that supply voltage to the piezoelectric layers, the internal electrode layers and piezoelectric layers being alternately provided; a first external electrode layer provided on a side of the laminated piezoelectric element and electrically connected with the internal electrode layers; a second external electrode layer provided on a side of the laminated piezoelectric element and electrically connected with the internal electrode layers via the first external electrode layer; and, a third external electrode layer provided on a side of the laminated piezoelectric element and provided between the first external electrode layer and the second external electrode layer; wherein, when the maximum width of the laminated piezoelectric element in the direction perpendicular to the direction of lamination is taken to be $W0$, the width of the first external electrode layer is taken to be $W1$, the width of the second external electrode layer is taken to be $W2$, the width of the third external electrode layer is taken to be $W3$, the thickness (after curing) of the second electrode layer is taken to be $T2$, and the thickness (after curing) of the third external electrode layer is taken to be $T3$, the relationship exists in which $W1 > W3 > W2$, $2.5 \leq (W2/W0) \times 100 \leq 60$, and $0.05 \leq (T2/T3) \leq 300$; and, the laminated piezoelectric element has a piezoelectric active section that expands and contracts when a voltage is applied, and the second external electrode layer is provided continuously in the direction of lamination of the piezoelectric layers in the piezoelectric active section.

According to this second aspect of the present invention, as the widths of the first through third external electrode layers are not the same, thermal stress generated in both ends of each external electrode layer can be dispersed. In addition, together with thermal stress generated in the second external electrode layer being alleviated by the first and third external electrode layers, thermal stress generated in the third external electrode layer can be alleviated by the first external electrode layer. In addition, if the relationship among the widths of the external electrode layer is such that $W1 > W3 > W2$, then thermal stress generated in the second or third external electrode layer is not applied directly to the piezoelectric. In addition, if $(W2/W0) \times 100$ is 2.5 or more, then bonding strength capable of bonding a lead wire or electrode plate connected to the second external electrode layer with the second external electrode layer can be secured. In addition, if $(W2/W0) \times 100$ is 60 or less, as thermal stress on the piezoelectric can be held to a low level, the formation of cracks can be inhibited. In addition, if the second external electrode layer is provided continuously in the piezoelectric active section in the direction of lamination of the piezoelectric layers, thermal stress applied to the first external electrode and piezoelectric active section from both ends of the second external electrode layer in the direction of lamination of the piezoelectric can be minimized. On the other hand, in the case the second external electrode layer is provided discontinuously in the piezoelectric active section in the direction of lamination of the piezoelectric layers, thermal stress is applied to the first external electrode and piezoelectric active section from both ends of the second external electrode layer in the direction of lamination of the piezoelectric, and cracks form easily in the piezoelectric active section. As the direction in which cracks spread is consistent with the direction of expansion and contraction of the piezoelectric active section, the spreading of cracks is promoted resulting in problems in terms of reliability. In addition, if T2/T1 is set to be 300 or less, as the thickness of the second external electrode layer is excessively large relative to the thickness of the first external electrode layer, the first external electrode layer acts as a stress alleviating material thereby inhibiting the formation of cracks in the piezoelectric. In addition, if T2/T1 is 0.05 or more, a bonding strength capable of bonding a lead wire or electrode plate connected to the second external electrode layer with the second external electrode layer can be secured.

Further, according to the invention, when the maximum width of the laminated piezoelectric element in the direction perpendicular to the direction of lamination is taken to be W0, the width of the second external electrode layer is taken to be W2, the thickness (after curing) of the second external electrode layer is taken to be T2, and the thickness (after curing) of the third external electrode layer is taken to be T3, a relationship should exist in which $5 \leq (W2/W0) \times 100 \leq 30$, and $1 \leq (T2/T3) \leq 35$. In the case $(W2/W0) \times 100$ is greater than 30, the continuous effect of inhibiting crack formation in the piezoelectric cannot be obtained. In addition, in the case $(W2/W0) \times 100$ is less than 5, bonding strength between a lead wire or electrode plate and the second external electrode layer is inadequate. In addition, in the case T2/T1 is greater than 35, as the thickness of the second external electrode plate is excessively large relative to the thickness of the first electrode plate acting as a stress alleviating material, its effect as a stress alleviating material decreases and cracks form in the piezoelectric. In addition, in the case T2/T1 is less than 1, bonding strength between a lead wire or electrode plate and the second external electrode layer is inadequate.

Furthermore, according to the invention, if the first external electrode layer, the second external electrode layer, and the third external electrode layer are all of different materials, when the coefficient of linear expansion of the first external electrode layer is taken to be $\alpha 1$ and its elastic modulus is taken to be E1, the coefficient of linear expansion of the second external electrode layer is taken to be $\alpha 2$ and its elastic modulus is taken to be E2, and the coefficient of linear expansion of the third external electrode layer is taken to be $\alpha 3$ and its elastic modulus is taken to be E3 in particular, a relationship should exist in which $E1 \times \alpha 1 < E3 \times \alpha 3 < E2 \times \alpha 2$. As a result, a material having high adhesive strength can be used for the material of the third external electrode layer that bonds a lead wire or electrode plate. As materials having high adhesive strength typically have a large elastic modulus, considerable thermal stress is applied to the piezoelectric. In the present invention, however, a material can be used for the material of the third external electrode layer that alleviates thermal stress generated in the second external electrode layer such that $E3 \times \alpha 3 < E2 \times \alpha 2$. In addition, if $E1 \times \alpha 1 < E3 \times \alpha 3 < E2 \times \alpha 2$, thermal stress can be alleviated in a stepwise manner.

Moreover, according to the invention, when the maximum width of the laminated piezoelectric element in the direction perpendicular to the direction of lamination is taken to be W0, it is preferable that $W0 \leq 15$ mm. If W0 is greater than 15 mm, width W2 of the second external electrode layer becomes 9.0 mm or more, and thermal stress generated in the second external electrode layer exceeds the strength of the piezoelectric layers, thereby resulting in greater susceptibility to crack formation in the piezoelectric.

In addition, according to the invention, if the first external electrode layer is composed of at least one metal selected from the group consisting of silver, palladium, platinum, copper, gold, nickel, tin, lead, zinc and bismuth, as well as an alloy thereof, when the elastic modulus of the first external electrode layer is taken to be E1 and its coefficient of linear expansion is taken to be $\alpha 1$, and the elastic modulus of the second external electrode layer is taken to be E2 and its coefficient of linear expansion is taken to be $\alpha 2$, as $E1 \times \alpha 1$ can be made to be smaller than $E2 \times \alpha 2$ in the case of using solder or an electrically conductive resin material for the second external electrode layer, the first external electrode layer acts as a buffer layer that alleviates thermal stress in the second external electrode layer, thereby making it possible to alleviate thermal stress applied to the laminated piezoelectric element from the second external electrode layer.

In addition, according to the invention, if the second external electrode layer and the third external electrode layer are composed of solder or an electrically conductive resin material, if a lead wire or electrode plate is connected to the second or third external electrode layer, the bonding strength of the lead wire or electrode plate with the second or third external electrode layer can be increased.

As described above, according to this second aspect of the present invention, a laminated piezoelectric element can be provided that realizes both secured bonding strength between a lead wire or electrode plate connected to the second external electrode layer and the second external electrode layer as well as inhibition of crack formation in the piezoelectric body.

In a third aspect of the present invention, a laminated piezoelectric element is provided that is provided with: a laminated piezoelectric element comprising piezoelectric layers composed of a ceramic capable of expanding and contracting upon application of a voltage, and internal electrode layers that supply voltage to the piezoelectric layers, the internal electrode layers and piezoelectric layers being alternately provided; and, a first external electrode layer provided on a side of the laminated piezoelectric element and electrically connected with the internal electrode layers; wherein, when the maximum width of the laminated piezoelectric element in the direction perpendicular to the direction of lamination is taken to be W0, and the width of the first external electrode layer is taken to be W1, the relationship exists in which $2.5 \leq (W1/W0) \times 100 \leq 60$; and, the laminated piezoelectric element has a piezoelectric active section that expands and contracts when a voltage is applied, and the first external electrode layer is provided continuously in the direction of lamination of the piezoelectric layers in the piezoelectric active section.

According to this third aspect of the present invention, $(W1/W0) \times 100$ is 2.5 or more, and bonding strength capable of bonding a lead wire or electrode plate connected to the first external electrode layer with the first external electrode layer can be secured. In addition, if (W1/W0)×100 is 60 or less, as the thermal stress on the piezoelectric can be held to a low level, the formation of cracks can be inhibited. In addition, if the first external electrode layer is provided continuously in the piezoelectric active section in the direction of lamination of the piezoelectric layers, thermal stress applied to the piezoelectric active section from both ends of the first external electrode layer in the direction of lamination of the piezoelectric can be minimized. In other words, as both ends of the first external electrode layer in the direction of lamination of the piezoelectric are substantially not located on the piezoelectric active section, if cracks form they have little effect on the piezoelectric active section. On the other hand, in the case the first external electrode layer is provided discontinuously in the piezoelectric active section in the direction of lamination of the piezoelectric layers, thermal stress is applied to the piezoelectric active section from both ends of the first external electrode layer in the direction of lamination of the piezoelectric, and cracks form easily in the piezoelectric active section. As the direction in which cracks spread is consistent with the direction of expansion and contraction of the piezoelectric active section, the spreading of cracks is promoted resulting in problems in terms of reliability.

Further, according to the invention, when the maximum width of the laminated piezoelectric element in the direction perpendicular to the direction of lamination is taken to be W0, and the width of the first external electrode layer is taken to be W1, a relationship should exist in which $5 \leq (W1/W0) \times 100 \leq 30$. In the case (W1/W0)×100 is greater than 30, the continuous effect of inhibiting crack formation in the piezoelectric cannot be obtained. In addition, in the case (W1/W0)×100 is less than 5, the bonding strength between a lead wire or electrode plate and the first external electrode layer is inadequate.

Furthermore, according to the invention, when the maximum width of the laminated piezoelectric element in the direction perpendicular to the direction of lamination is taken to be W0, it is preferable that $W0 \leq 15$ mm. In the case W0 exceeds 15 mm, width W1 of the first external electrode layer becomes 9.0 mm or more, and the thermal stress generated in the second external electrode layer exceeds the strength of the piezoelectric layers, thereby resulting in greater susceptibility to the formation of cracks in the piezoelectric body.

Moreover, according to the invention, if the first external electrode layer is composed of a metal consisting of at least one among silver, palladium, platinum, copper, gold, nickel, tin, lead, zinc and bismuth, or an alloy thereof, there is less thermal stress and thermal stress applied to the piezoelectric can be reduced.

In addition, according to the invention, if the first external electrode layer is composed of solder of an electrically conductive resin material, in the case a lead wire or electrode plate is connected to the first external electrode layer, bonding strength of the lead wire or electrode plate with the first external electrode layer can be increased.

As described above, according to this third aspect of the present invention, a laminated piezoelectric element can be provided that realizes both a secure bonding strength between a lead wire or electrode plate connected to the first external electrode layer and the first external electrode layer as well as inhibition of crack formation in the piezoelectric body.

In addition, according to another aspect of the present invention, there is provided a fuel injection apparatus. When the piezoelectric element is used in the conventional fuel injection apparatus, reliability must be ensured over a broad temperature range extending from low temperatures to high temperatures. According to the present invention, even in environments in which a fuel injection apparatus is subjected to such thermal shock, a fuel injection apparatus can be provided that is resistant to changes in characteristics and maintains a high level of reliability for a long period of time because the formation of cracks in the piezoelectric element caused by thermal stress attributable to external electrodes can be inhibited.

BRIEF DESCRIPTION OF THE DRAWINGS

FIG. 8 is an explanatory drawing (1) showing the constitution of a laminated piezoelectric element according to a third embodiment of the present invention;

DETAILED DESCRIPTION OF THE INVENTION

The present invention will be further described with regard to the preferred embodiments thereof, referring to the accompanying drawings.

Embodiment 1

Figure 1A:
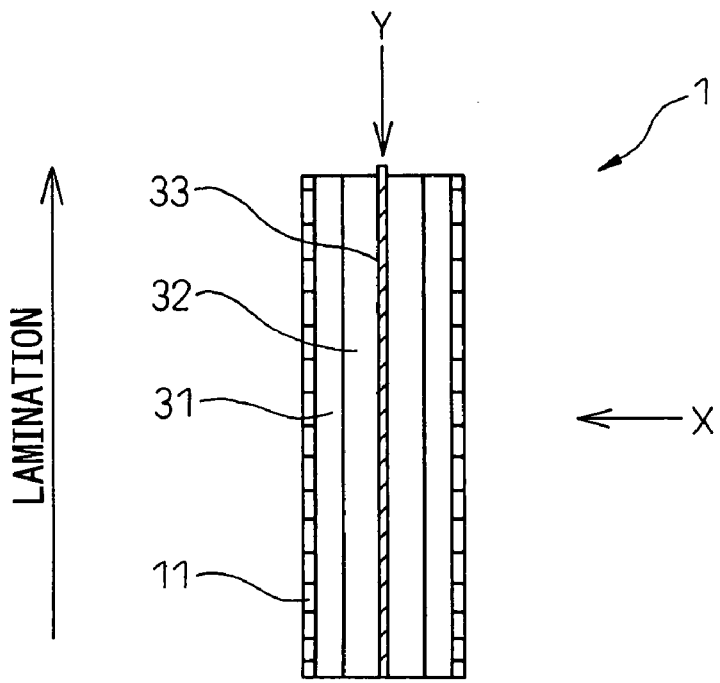
FIGS. 1A to 1C are each an explanatory drawing (1) showing the constitution of a laminated piezoelectric element according to a first embodiment of the present invention.
Figure 1B:
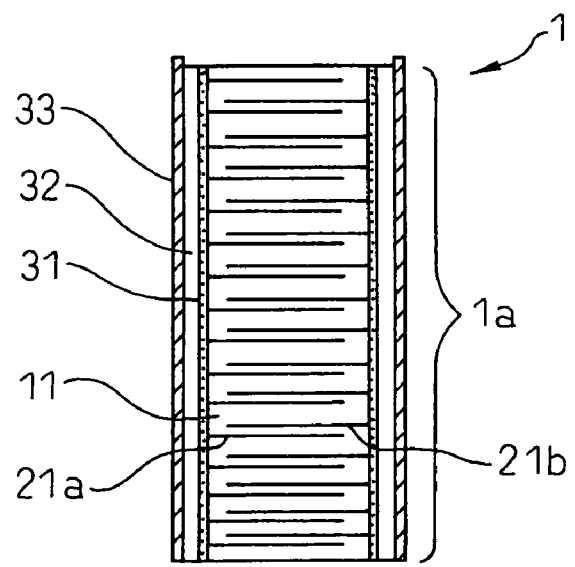
Figure 1C:
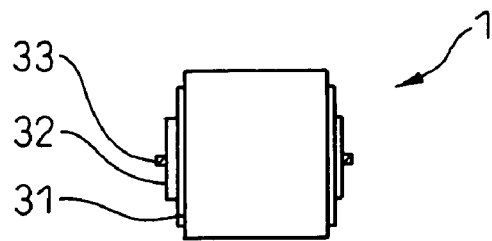

The following provides an explanation of the constitution of a first embodiment of the present invention referring to the drawings. FIGS. 1A to 1C are each an explanatory drawing showing a frontal view (FIG. 1A), a perspective view as viewed from arrow X in FIG. 1A (FIG. 1B), and a perspective view as viewed from arrow Y in FIG. 1A (FIG. 1C) of a laminated piezoelectric 1 of the present embodiment. As shown, laminated piezoelectric element 1 according to the present embodiment is, broadly speaking, provided with piezoelectric layers 11, internal electrode layers 21a and 21b, first external electrode layer 31, second external electrode layer 32 and lead wire 33, and is roughly composed in the manner described below. Namely, laminated piezoelectric element 1 is alternately provided with a plurality of piezoelectric layers 11 composed of a PZT ceramic material that expands and contracts when a voltage is applied, and internal electrode layers 21 for supplying an applied voltage. A first electrode 31 is provided on the outer peripheral side of laminated piezoelectric element 1 that is electrically connected so that internal electrode layers 21a and 21b serve as different poles. Lead wire 33 is provided on first external electrode layer 31 via second external electrode layer 32.

Figure 2A:
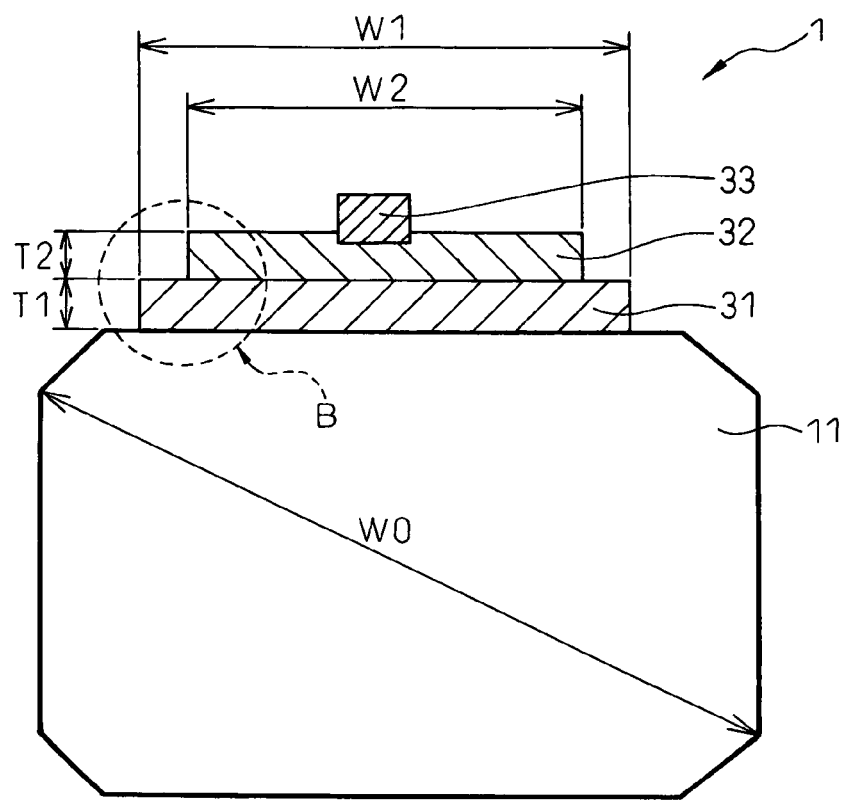
FIGS. 2A and 2B are each an enlarged explanatory drawing of the essential portion of FIG. 1.
Figure 2B:
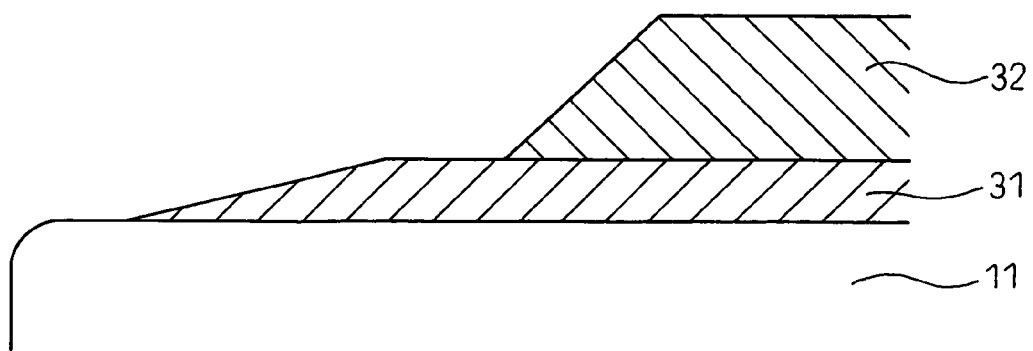

The following provides an explanation of the characteristics of a first aspect of the present invention. FIGS. 2A and 2B are each an enlarged view of the essential portion of laminated piezoelectric 1 according to the present embodiment. FIG. 2A is a schematic drawing, and FIG. 2B shows a section B that is encircled in FIG. 2A. As shown, in a laminated piezoelectric 1 of the present embodiment, when the maximum width of piezoelectric 11 in the direction perpendicular to the direction of lamination is taken to be W0, the width of first external electrode 31 is taken to be W1, and the width of second external electrode 32 is taken to be W2, the relationship exists in which W1>W2 and $2.5 \leq (W2/W0) \times 100 \leq 60$. As a result, as the widths of first external electrode layer 31 and second external electrode layer 32 are not the same, thermal stress generated at both ends of first external electrode layer 31 and second external electrode layer 32 can be dispersed. In addition, as W1>W2, thermal stress generated in second external electrode layer 32 is not applied directly to piezoelectric 11. In addition, as there exists the relationship in which $2.5 \leq (W2/W0) \times 100 \leq 60$, and thermal stress applied to piezoelectric 11 can be alleviated, together with inhibiting the formation of cracks, bonding strength between lead wire 33 connected to second external electrode layer 32 and second external electrode layer 32 is adequate. In addition, it is more effective if the aforementioned relationship be such that $5 \leq (W2/W0) \times 100 \leq 30$ (the effects of this will be described later).

In addition, as second external electrode layer 32 is provided continuously in the direction of lamination of piezoelectric layers 11 in piezoelectric active section 1a that expands and contracts when a voltage is applied, the thermal stress applied to first external electrode layer 31 and piezoelectric 11 from both ends of second external electrode 32 in the direction of lamination of piezoelectric 11 can be minimized.

In addition, when the thickness (after curing) of first external electrode layer 31 is taken to be T1, and the thickness (after curing) of second external electrode layer 32 is taken to be T2, T2/T1 is within the range of 0.05 to 300. As a result, as the thickness of second external electrode layer 32 is not excessively large relative to the thickness of first external electrode layer 31, first external electrode layer 31 is able to act as a stress alleviating material and inhibit the formation of cracks in the piezoelectric. In addition, a bonding strength capable of bonding lead wire 33 connected to second external electrode layer 32 with second external electrode layer 32 can be secured. In addition, it is more effective if this relationship is such that $1 \leq (T2/T1) \leq 35$ (the effects of this will be described later).

In addition, the maximum width W0 of piezoelectric 11 in the direction perpendicular to the direction of lamination is 15 mm or less. As a result, width W2 of second external electrode layer 32 is 9.0 mm or less, and thermal stress generated in second external electrode layer 32 does not exceed the strength of piezoelectric layers 11, thereby making it difficult for cracks to form in piezoelectric layers 11.

Figure 3A:
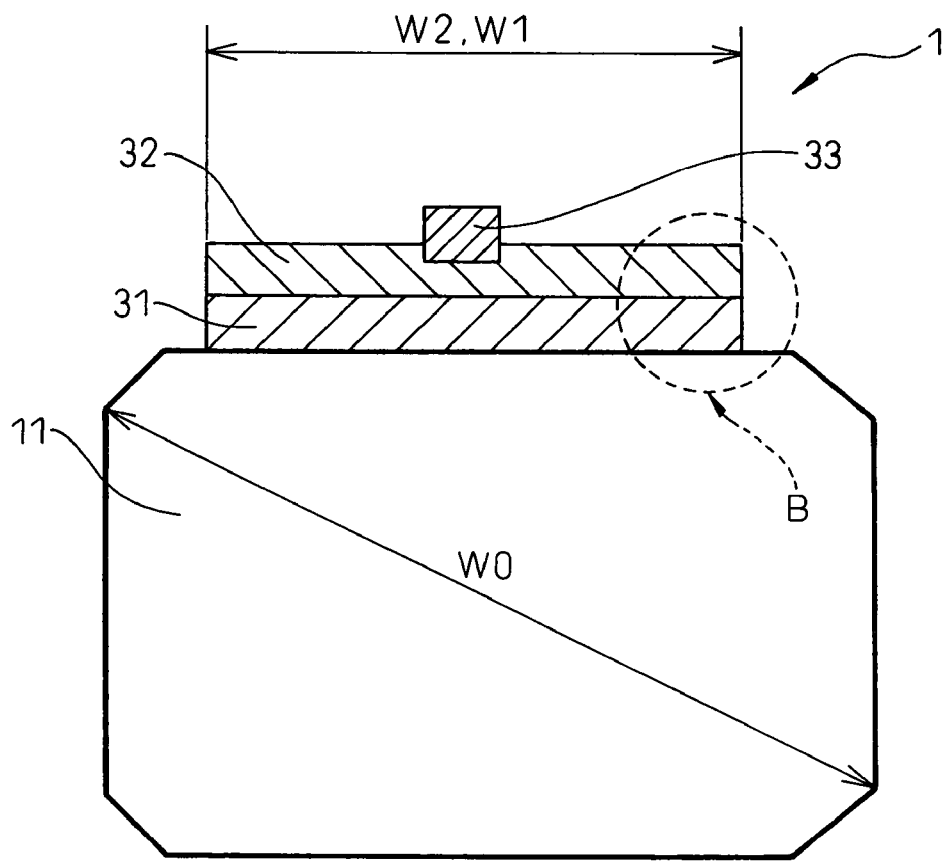
FIGS. 3A and 3B are each an enlarged explanatory drawing of the essential portion of the prior art laminated piezoelectric element.
Figure 3B:
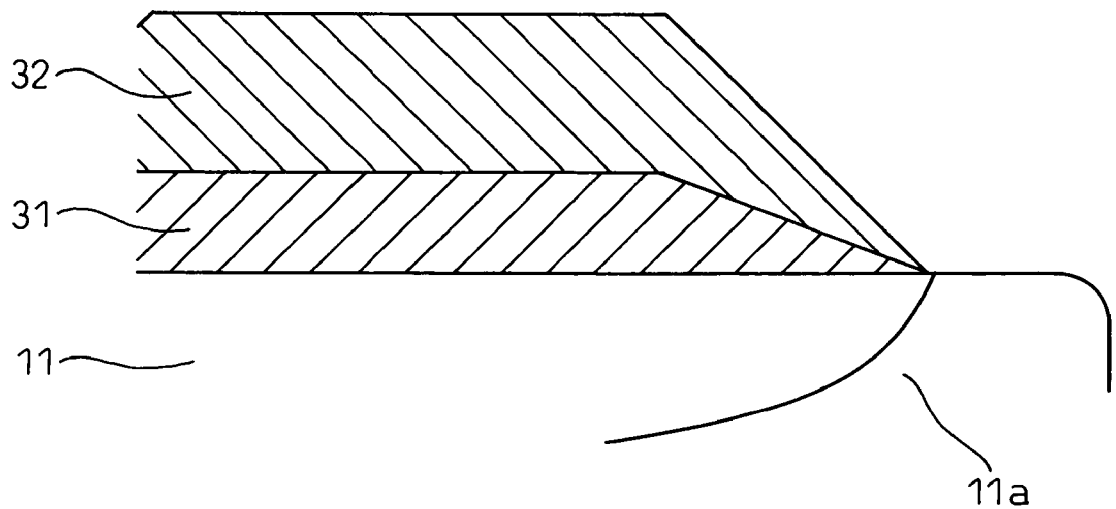

FIGS. 3A and 3B are each an explanatory drawing for explaining the case in which width W1 of first external electrode layer 31 and width W2 of second external electrode layer 32 are the same. FIG. 3A is a schematic drawing, and FIG. 3B shows the manner of the formation of cracks at portion B that is encircled in FIG. 3A. As shown, in laminated piezoelectric element 1 in which exists the relationship W1=W2, since stress generated at both ends of first external electrode layer 31 and second external electrode layer 32 is concentrated at piezoelectric 11, cracks form easily in piezoelectric 11 as shown in crack 11a.

The effects of a first aspect of the present invention will be explained in the following tables. Table 1 shows the relationship between W1 and W2 along with the results of measuring thermal stress on the piezoelectric for (W2/W0)× 100 when the maximum width of piezoelectric 11 in the direction perpendicular to the direction of lamination is taken to be W0, the width of first external electrode layer 31 is taken to be W1, and the width of second external electrode layer 32 is taken to be W2. As shown in Table 1, in the case the relationship between W1 and W2 is such that W1=W2, stress generated on the piezoelectric is the greatest, and the generated stress becomes smaller in the order of the case in which W2>W1 followed by the case in which W1>W2. In addition, in the case W1>W2, the smaller the value of (W2/W0)×100, the smaller the amount of stress generated on the piezoelectric. On the basis of this table, the stress generated on the piezoelectric can be seen to become smaller in the case W1>W2 and the smaller the value of (W2/W0)× 100.

TABLE 1

| No. | Relationship Between W1 and W2 | (W2/W0) × 100 | Stress Generated on Piezoelectric body (MPa) |
|---|---|---|---|
| 1 | W1 = W2 | 42.0 | 76.2 |
| 2 | W2 > W1 | 42.0 | 70.0 |
| 3 | W1 > W2 | 60 | 50.4 |
| 4 | | 42 | 40.2 |
| 5 | | 35 | 30.3 |
| 6 | | 30 | 23.0 |
| 7 | | 24.9 | 20.4 |
| 8 | | 18.0 | 17.7 |
| 9 | | 10.0 | 15.2 |
| 10 | | 4.97 | 13.8 |
| 11 | | 0.98 | 10.1 |

Table 2 shows the relationship between W1 and W2, the number of cycles as an indicator of durability, and the results of measuring adhesive strength between second external electrode layer 32 and lead wire 33 for (W2/W0)×100 when the maximum width of piezoelectric 11 in the direction perpendicular to the direction of lamination is taken to be W0, the width of first external electrode layer 31 is taken to be W1, and the width of second external electrode layer 32 is taken to be W2. The following provides an explanation of the test method. A liquid tank thermal shock tester for performing thermal shock tests was used in the durability test in the present embodiment. First, n (for example, 20) piezoelectric elements to be tested were placed in a sealed container. Next, the piezoelectric elements contained in the sealed container were immersed in a high-temperature liquid tank maintained at a temperature of 160° C. within the liquid tank thermal shock tester and held there for a predetermined amount of time (for example, 10 minutes). Next, the piezoelectric elements contained in the sealed container were immersed in a low-temperature liquid tank maintained at a temperature of −40° C. within the liquid tank thermal shock tester, and held there for a predetermined amount of time (for example, 10 minutes). The process of immersing in the high-temperature liquid tank and the process of immersing in the low-temperature liquid tank were defined as one cycle, and this cycle was repeated. The piezoelectric elements were removed from the liquid tank thermal shock tester when the number of cycles reached 100, 500, 1000 and 1500 cycles followed by confirmation of the formation of cracks in the piezoelectric elements. The piezoelectric elements were evaluated as GOOD in the case there were no cracks in any of the piezoelectric elements at this time, and evaluated as NG (No Good) if even one crack had formed. Here, in the case of using a laminated piezoelectric element according to the present embodiment in an automobile fuel injection apparatus, the result of the evaluation is preferably GOOD when the number of cycles is 1000 or more. In addition, an autographic apparatus for carrying out tensile strength tests on metal materials on so forth was used to measure adhesive strength between second external electrode layer 32 and lead wire 33 in the present embodiment. First, the lead wire was pulled at a constant speed with the autographic apparatus while adjusting the position of the piezoelectric element so that the direction of pulling by the autographic apparatus and the tangent between the piezoelectric element 1 and lead wire 33 were roughly horizontal. Next, the tensile strength when lead wire 33 was partially separated from the piezoelectric element was measured until lead wire 33 completely separated from piezoelectric element 1, and the average value was defined as the adhesive strength of the lead wire.

As shown in Table 2, although sample no. 1 demonstrated the largest adhesive strength between second external electrode layer 32 and lead wire 33 among all the samples, it was evaluated as NG at 100 to 1500 cycles, thus indicating a problem with durability. Although sample nos. 2 and 3 were evaluated as GOOD at 100 and 500 cycles, they were evaluated as NG at 1000 and 1500 cycles. Although sample no. 4 was evaluated as GOOD at 100 and 1000 cycles, it was evaluated as NG at 1500 cycles. Sample nos. 5 to 7 were all evaluated as GOOD at 100 to 1500 cycles, and demonstrated satisfactory durability. Although sample no. 8 was evaluated as GOOD at 100 to 1500 cycles, the adhesive strength between second external electrode layer 32 and lead wire 33 was inadequate.

It was determined from this table that durability is satisfactory in the case of the relationship indicated in sample nos. 5 to 7. Here, the actual dimensions of each parameter in sample no. 5, for example, consisted of W0=8.4 mm, W1=1.6 mm and W2=4.0 mm. The present invention is not limited to the case of these dimensions, but rather in the case the relationship between W1 and W2 is such that W1>W2, and in the case (W2/W0)×100 is within the range of 5 to 30, durability is satisfactory and adhesive strength between second external electrode layer 32 and lead wire 33 is adequate.

TABLE 2

| No. | Relationship between W1 and W2 | (W2/W0) × 100 | No. of Cycles | | | | Avg. lead wire adhesive strength (N) |
|---|---|---|---|---|---|---|---|
| | | | 100 | 500 | 1000 | 1500 | |
| 1 | W2 > W1 | 61.4 | NG | NG | NG | NG | 3.9 |
| 2 | W1 > W2 | 61.4 | GOOD | GOOD | NG | NG | 3.8 |
| 3 | | 40.3 | GOOD | GOOD | NG | NG | 3.3 |
| 4 | | 25.0 | GOOD | GOOD | GOOD | NG | 1.9 |
| 5 | | 19.0 | GOOD | GOOD | GOOD | GOOD | 1.3 |
| 6 | | 6.1 | GOOD | GOOD | GOOD | GOOD | 0.4 |
| 7 | | 7.0 | GOOD | GOOD | GOOD | GOOD | 0.3 |
| 8 | | 2.5 | GOOD | GOOD | GOOD | GOOD | 0.1 |

Table 3 shows the number of cycles as an indicator of durability and the results of measuring adhesive strength between second external electrode layer 32 and lead wire 33 for the relationship between T1 and T2 when the thickness (after curing) of first external electrode 31 in piezoelectric 11 is taken to be T1, and the thickness (after curing) of second external electrode layer 32 is taken to be T2. The test method is the same as that of the previously described test method. As shown in Table 3, sample nos. 1 to 4 were all evaluated as GOOD at 100 to 1500 cycles, indicating satisfactory durability. Although sample no. 5 was evaluated as GOOD at 100 to 1000 cycles, it was evaluated as NG at 1500 cycles. Although sample no. 6 was evaluated as GOOD at 100 and 500 cycles, it was evaluated as NG at 1000 and 1500 cycles.

It was determined from this table that durability is satisfactory in the case of the relationship indicated in sample nos. 1 to 4. Here, the actual dimensions of each parameter in sample no. 3, for example, consisted of T1=0.015 mm and T2=0.15 mm. The present invention is not limited to the case of these dimensions, but rather if the relationship between T1 and T2 is such that T2/T1 is within the range of 1 to 35, durability is satisfactory and adhesive strength between second external electrode layer 32 and lead wire 33 is adequate.

TABLE 3

| No. | T2/T1 | No. of Cycles | | | | Avg. lead wire adhesive strength (N) |
| --- | --- | --- | --- | --- | --- | --- |
|     |       | 100  | 500  | 1000 | 1500 |     |
| 1 | 0.05 | GOOD | GOOD | GOOD | GOOD | 0.3 |
| 2 | 5    | GOOD | GOOD | GOOD | GOOD | 0.4 |
| 3 | 10   | GOOD | GOOD | GOOD | GOOD | 1.5 |
| 4 | 20   | GOOD | GOOD | GOOD | GOOD | 3.2 |
| 5 | 40   | GOOD | GOOD | GOOD | NG   | 5.0 |
| 6 | 200  | GOOD | GOOD | NG   | NG   | 6.1 |

The following provides an explanation of other embodiments according to a first aspect of the present invention referring to FIGS. 4A to 4C to FIGS. 6A to 6C. FIGS. 4A to 4C to FIGS. 6A to 6C are explanatory drawings showing a laminated piezoelectric element produced by laminating laminated piezoelectric units. The laminated piezoelectric element 1 shown in these drawings is roughly composed in the manner described below. Namely, laminated piezoelectric element 1 is composed of a plurality of piezoelectric units 1u, and the plurality of piezoelectric units 1u are laminated by means of piezoelectric unit bonding surfaces 1b composed of an adhesive. A first external electrode layer 31 is provided on the outer peripheral side of laminated piezoelectric element 1 that is electrically connected so that internal electrode layers 21a and 21b serve as different poles. Lead wire 33 is provided on first external electrode layer 31 via second external electrode layer 32.

Furthermore, the plurality of piezoelectric units 1u may also be laminated without using piezoelectric unit bonding surfaces 1b composed of adhesive.

Figure 4A:
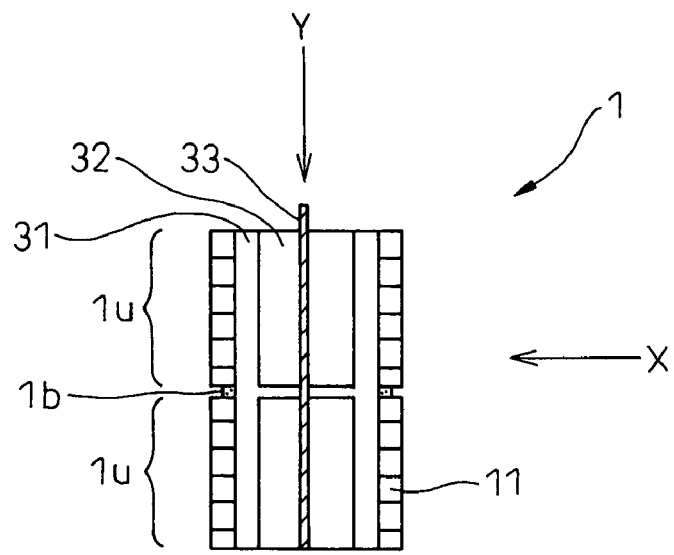
FIGS. 4A to 4C are each an explanatory drawing (2) showing the constitution of a laminated piezoelectric element according to a first embodiment of the present invention.
Figure 4B:
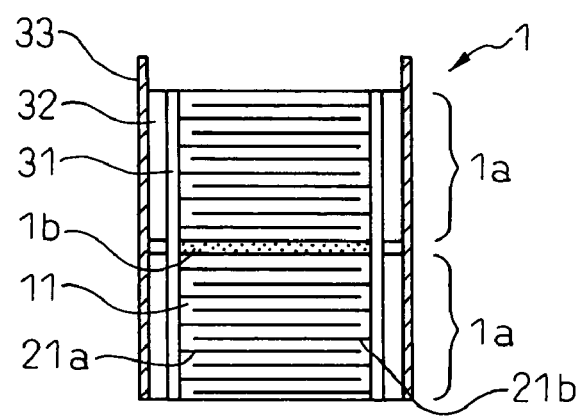
Figure 4C:
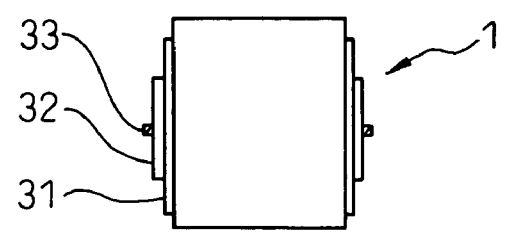

In the laminated piezoelectric element 1 shown in FIGS. 4A to 4C, a second external electrode layer 32 is provided separated by piezoelectric unit bonding surfaces 1b and, as it is difficult for second external electrode layer 32 to conform to piezoelectric unit bonding surfaces 1b, in the case second external electrode layer 32 is composed of an electrically conductive resin, displacement in piezoelectric layers 11 is restricted by the adhesive component of the electrically conductive resin, thereby making it possible to prevent any decreases in the characteristics, the reliability and so forth. In addition, in comparison with the case of second external electrode layer 32 being provided across piezoelectric unit bonding surfaces 1b, as the bonding surface between second external electrode layer 32 and lead wire 33 bonded to second external electrode layer 32 is smaller, it is difficult to impair expansion and contraction of lead wire 33. Furthermore, although first external electrode layer 31 is provided across piezoelectric unit bonding surfaces 1b, if the first external electrode layer 31 is composed of art clay silver, since this typically forms a film having a high viscosity, it is difficult to make it conform to piezoelectric unit bonding surfaces 1b.

Figure 5A:
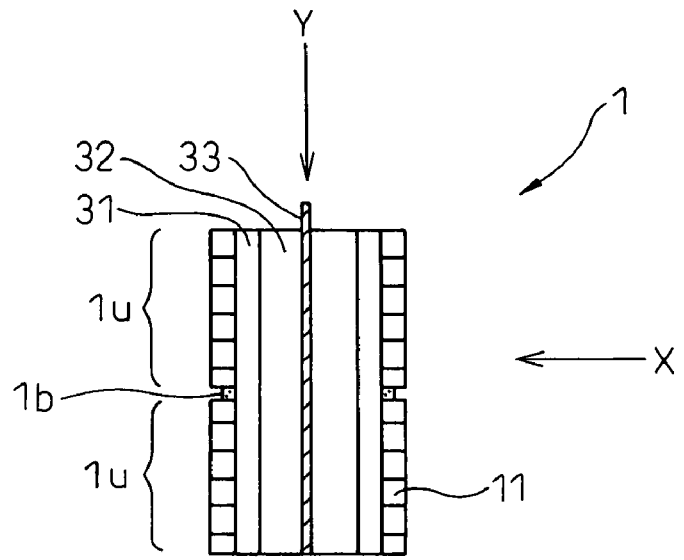
FIGS. 5A to 5C are each an explanatory drawing (3) showing the constitution of a laminated piezoelectric element according to a first embodiment of the present invention.
Figure 5B:
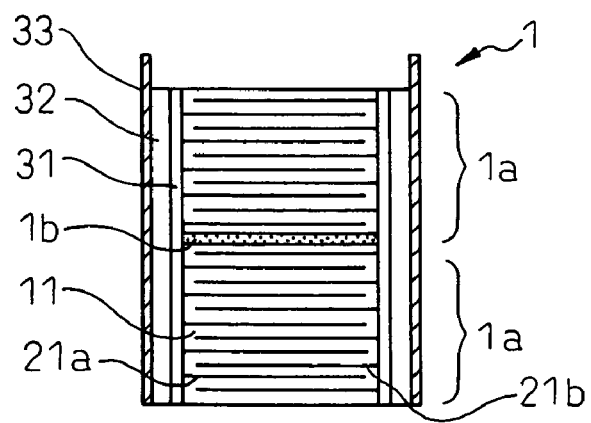
Figure 5C:
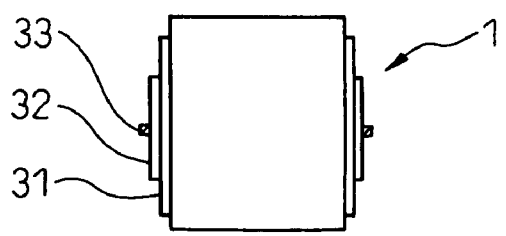

In the laminated piezoelectric element 1 shown in FIGS. 5A to 5C, as second external electrode layer 32 is provided across piezoelectric unit bonding surfaces 1b, second external electrode layer 32 can be coated at once, thereby allowing the production of products at low cost. In addition, although first external electrode layer 31 is provided across piezoelectric unit bonding surfaces 1b, in the case first external electrode layer 31 is composed of art clay silver, as this typically forms a film having a high viscosity, it is difficult to make it conform to piezoelectric unit bonding surfaces 1b.

Figure 6A:
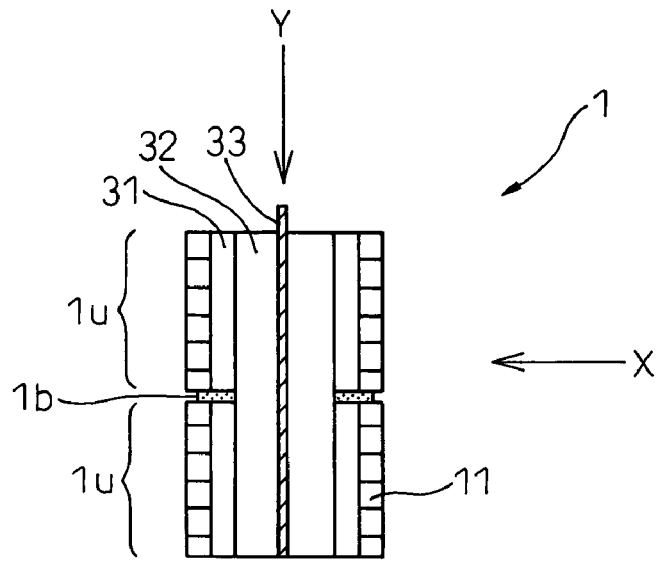
FIGS. 6A to 6C are each an explanatory drawing (4) showing the constitution of a laminated piezoelectric element according to a first embodiment of the present invention.
Figure 6B:
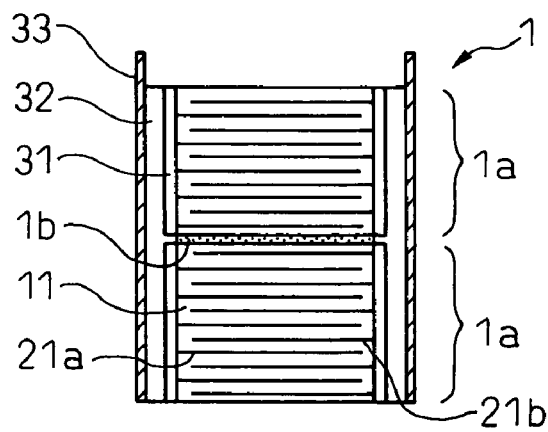
Figure 6C:
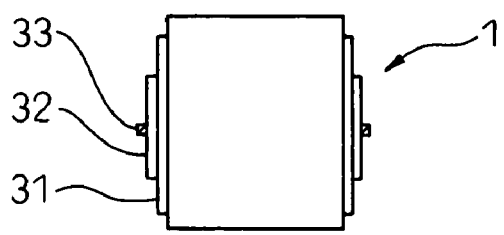

In the laminated piezoelectric element shown in FIGS. 6A to 6C, as second external electrode layer 32 is provided across piezoelectric unit bonding surfaces 1b, a second external electrode layer 32 can be coated at once, thereby allowing the production of products at low cost. In addition, as a first external electrode layer 31 is provided separated by piezoelectric unit bonding surfaces 1b, it is difficult to make it to conform to piezoelectric unit bonding surfaces 1b. In addition, the piezoelectric units can be individually produced and inspected prior to bonding the piezoelectric units, thereby making it possible to improve the productivity as a result of early detection of defective products.

In the laminated piezoelectric elements composed by bonding laminated piezoelectric units as shown in FIGS. 4A to 4C to FIGS. 6A to 6C as well, when the maximum width of piezoelectric 11 in the direction perpendicular to the direction of lamination is taken to be W0, the width of first external electrode layer 31 is taken to be W1, and the width of second external electrode layer 32 is taken to be W2, W1>W2 and $2.5 \leq (W2/W0) \times 100 \leq 60$. As a result, as the widths of first external electrode layer 31 and second external electrode layer 32 are not the same, thermal stress generated in both ends of first external electrode layer 31 and second external electrode layer 32 can be dispersed. In addition, since W1>W2, thermal stress generated in second external electrode layer 32 is not applied directly to piezoelectric 11. In addition, as the relationship exists in which $2.5 \leq (W2/W0) \times 100 \leq 60$, thermal stress on piezoelectric 11 is alleviated and, together with the formation of cracks in the piezoelectric being inhibited, bonding strength between lead wire 33 connected to second external electrode layer 32 and second external electrode layer 32 is adequate. In addition, the relationship in which $5 \leq (W2/W0) \times 100 \leq 30$ is even more effective. (the effects of this will be described later.) In addition, as a second external electrode layer 32 is provided continuously in the direction of lamination of piezoelectric layers 11 in piezoelectric active section 1a that expands and contracts when a voltage is applied, thermal stress applied to first external electrode layer 31 and piezoelectric 11 from both ends of second external electrode layer 32 in the direction of lamination of piezoelectric 11 can be minimized.

Embodiment 2

Figure 7A:
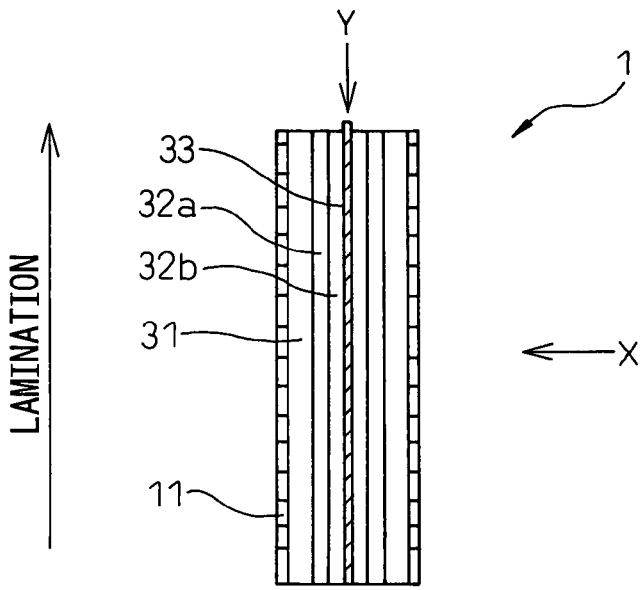
FIGS. 7A and 7B are each an explanatory drawing (1) showing the constitution of a laminated piezoelectric element according to a second embodiment of the present invention.
Figure 7B:
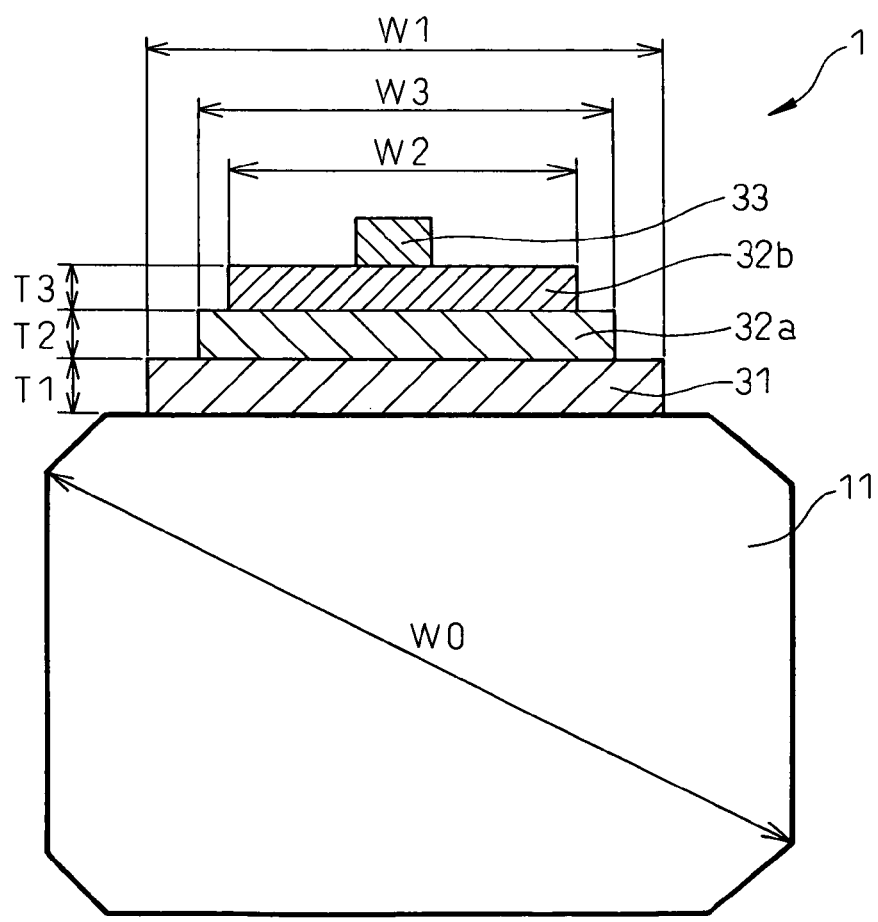

The following provides an explanation of the constitution of a second embodiment of the present invention referring to the drawings. FIGS. 7A and 7B are each an explanatory drawing showing a laminated piezoelectric element according to a second embodiment of the present invention. As shown, laminated piezoelectric element 1 of the present embodiment has a first external electrode layer 31 provided on the outer peripheral side of a plurality of piezoelectric layers 11 composed of PZT ceramic that expands and contracts when a voltage is applied. A third external electrode layer 32a is provided on first external electrode layer 31. A second external electrode layer 32b is provided on third external electrode layer 32a.

This second aspect of the present invention is characterized in that, when the maximum width of laminated piezoelectric element 1 in the direction perpendicular to the direction of lamination is taken to be W0, the width of first external electrode layer 31 is taken to be W1, the width of second external electrode layer 32b is taken to be W2, the width of third external electrode layer 32a is taken to be W3, the thickness (after curing) of second external electrode layer 32b is taken to be T2, and the thickness (after curing) of third external electrode layer 32a is taken to be T3, the relationship exists in which W1>W3>W2, $5 \leq (W2/W0) \times 100 \leq 30$ and $1 \leq (T2/T3) \leq 35$. In addition, first external electrode layer 31, second external electrode layer 32b and third external electrode layer 32a are all made of different materials. In addition, when the elastic modulus of first external electrode layer 31 is taken to be E1 and the coefficient of linear expansion is taken to be $\alpha 1$, the elastic modulus of second external electrode layer 32a is taken to be E2 and the coefficient of linear expansion is taken to be $\alpha 2$, and the elastic modulus of third external electrode layer 32a is taken to be E3 and the coefficient of linear expansion is taken to be $\alpha 3$, $E1 \times \alpha 1 < E3 \times \alpha 3 < E2 \times \alpha 2$.

According to this second aspect of the present invention, as the widths of first external electrode layer 31, second external electrode layer 32b and third external electrode layer 32a are not the same, thermal stress generated in both ends of each of these external electrode layers can be dispersed. In addition, together with thermal stress generated in second external electrode layer 32b being alleviated by first external electrode layer 31 and third external electrode layer 32a, thermal stress generated in third external electrode layer 32a can be alleviated by first external electrode layer 31. In addition, as W1>W3>W2, thermal stress generated in second external electrode layer 32b and third external electrode layer 32a is not applied directly to piezoelectric 11. In addition, as $5 \leq (W2/W0) \times 100 \leq 30$ and $1 \leq (T2/T3) \leq 35$, thermal stress on piezoelectric 11 is alleviated and, together with the formation of cracks in piezoelectric 11 being inhibited, the bonding strength between lead wire 33 connected to second external electrode layer 32b and second external electrode layer 32b is adequate.

In addition, first external electrode layer 31, second external electrode layer 32b and third external electrode layer 32a are all made of different materials. In addition, when the elastic modulus of first external electrode layer 31 is taken to be E1 and the coefficient of linear expansion is taken to be $\alpha 1$, the elastic modulus of second external electrode layer 32a is taken to be E2 and the coefficient of linear expansion is taken to be $\alpha 2$, and the elastic modulus of third external electrode layer 32a is taken to be E3 and the coefficient of linear expansion is taken to be $\alpha 3$, the relationship exists in which $E1 \times \alpha 1 < E3 \times \alpha 3 < E2 \times \alpha 2$. As a result, a material having high adhesive strength can be used for the material of second external electrode layer 32b that bonds a lead wire and electrode plate. As materials having high adhesive strength typically also have a large elastic modulus, considerable thermal stress is applied to piezoelectric 11. In the present invention, however, a material for which the product of the elastic modulus and coefficient of linear expansion is small so as to enable thermal stress generated in second external electrode layer 32b to be alleviated can be used for the material of third external electrode layer 32a. In addition, since $E1 \times \alpha 1 < E3 \times \alpha 3 < E2 \times \alpha 2$, thermal stress can be alleviated in a stepwise manner.

In addition, as a second external electrode layer 32b is provided continuously in the direction of lamination of piezoelectric layers 11 in piezoelectric active section 1a that expands and contracts when a voltage is applied, thermal stress applied to first external electrode layer 31, third external electrode layer 32a and piezoelectric 11 from both ends of second external electrode 32b in the direction of lamination of piezoelectric 11 can be minimized.

In addition, the maximum width W0 of piezoelectric 11 in the direction perpendicular to the direction of lamination is 15 mm or less. As a result, width W2 of second external electrode layer 32b is 9.0 mm or less, thermal stress generated in second external electrode layer 32b does not exceed the strength of piezoelectric layers 11, and it is difficult for cracks to form in piezoelectric layers 11.

The effects of this second aspect of the present invention will be explained in the following tables. Table 4 shows the relationship between W1, W2 and W3 and the results of measuring the stress generated on the piezoelectric for (W2/W0)×100 and T2/T3 when the maximum width of piezoelectric 11 in the direction perpendicular to the direction of lamination is taken to be W0, the width of first external electrode layer 31 is taken to be W1, the width of second external electrode layer 32b is taken to be W2, the width of third external electrode layer 32a is taken to be W3, the thickness (after curing) of second external electrode layer 32b is taken to be T2, and the thickness (after curing) of third external electrode layer 32a is taken to be T3. As shown in Table 4, in the case the relationship among W1, W2 and W3 is such that W1=W2=W3, the stress generated on the piezoelectric is the greatest, and subsequently becomes smaller in the order of the case in which W2>W1 (two external electrode layers instead of three) and the case in which W1>W3>W2. In addition, in the case W1>W3>W2, the smaller the value of T2/T3, the smaller the stress generated on the piezoelectric. It can be understood from the table that, in the case the relationship among W1, W2 and W3 is such that W1>W3>W2, the smaller the value of T2/T3, the smaller is the stress generated on the piezoelectric.

TABLE 4

| No. | Relationship among W1, W2 and W3 | (W2/W0) × 100 | T2/T3 | Stress generated on piezoelectric body (MPa) |
|---|---|---|---|---|
| 1 | W2 > W1 (2 layers) | 42.0 | — | 70.0 |
| 2 | W1 > W2 (2 layers) | 42.0 | — | 40.2 |
| 3 | W1 = W2 = W3 | 42.0 | 5.0 | 80.1 |
| 4 | W1 > W3 > W2 | 38.1 | 5.0 | 17.4 |
| 5 |  | 38.1 | 8.3 | 20.4 |

Table 5 shows the relationship among W1, W2 and W3, the number of cycles as an indicator of durability, and the results of measuring adhesive strength between second external electrode layer 32b and lead wire 33 for (W2/W0)× 100 and T2/T3 when the maximum width of piezoelectric 11 in the direction perpendicular to the direction of lamination is taken to be W0, the width of first external electrode layer 31 is taken to be W1, the width of second external electrode layer 32b is taken to be W2, the width of third external electrode layer 32a is taken to be W3, the thickness (after curing) of second external electrode layer 32b is taken to be T2, and the thickness (after curing) of third external electrode layer 32a is taken to be T3. The remainder of the test method is the same as Embodiment 1. As shown in Table 5, all of the samples of nos. 1 to 3 were evaluated as GOOD at 100 to 1500 cycles, thus indicating a satisfactory durability.

31 is taken to be W1, a relationship exists in which $2.5 \leq (W1/W0) \times 100 \leq 60$. As a result, as a relationship exists in which $2.5 \leq (W1/W0) \times 100 \leq 60$, and thermal stress applied to piezoelectric 11 can be alleviated, together with inhibiting the formation of cracks, the bonding strength between lead wire 33 connected to first external electrode layer 31 and first external electrode layer 31 is adequate. In addition, the relationship in which $5 \leq (W1/W0) \times 100 \leq 30$ is even more effective.

TABLE 5

| No. | Relationship among W1, W2 and W3 | (W2/W0) × 100 | T2/T3 | Material of second external electrode layer | Material of first external electrode layer | No. of cycles | | | | Avg. lead wire adhesive strength (N) |
|---|---|---|---|---|---|---|---|---|---|---|
| | | | | | | 100 | 500 | 1000 | 1500 | |
| 1 | W1 > W3 > W2 | 15.0 | 5.0 | A | A | GOOD | GOOD | GOOD | GOOD | 1.3 |
| 2 | | 15.1 | 8.3 | A | A | GOOD | GOOD | GOOD | GOOD | 1.8 |
| 3 | | 15.1 | 1.5 | B | A | GOOD | GOOD | GOOD | GOOD | 1.3 |

The following provides an explanation of another embodiment according to this second aspect of the present invention. As the laminated piezoelectric element 1 shown in FIG. 8 has roughly the same constitution as the laminated piezoelectric element 1 shown in the aforementioned FIGS. 7A and 7B, an explanation is only provided of the difference between the two, namely the relationship of the widths of the external electrode layers. Namely, although the relationship exists in which W1>W3>W2 in the laminated piezoelectric element 1 shown in FIGS. 7A and 7B when the width of first external electrode layer 31 is taken to be W1, the width of second external electrode layer 32b is taken to be W2, and the width of third external electrode layer 32a is taken to be W3, in the laminated piezoelectric element shown in FIG. 8, this relationship differs in that W1>W2>W3. However, the two are the same with respect to the following points. Namely, as the widths of first external electrode layer 31 and second external electrode layer 32b are not the same, thermal stress generated in both ends of first external electrode layer 31 and second external electrode layer 32b can be dispersed. In addition, as W1>W2, thermal stress generated in second external electrode layer 32b is not applied directly to piezoelectric 11. Accordingly, a laminated piezoelectric element 1 can be provided that is capable of inhibiting the formation of cracks in piezoelectric layers 11.

Embodiment 3

Figure 9A:
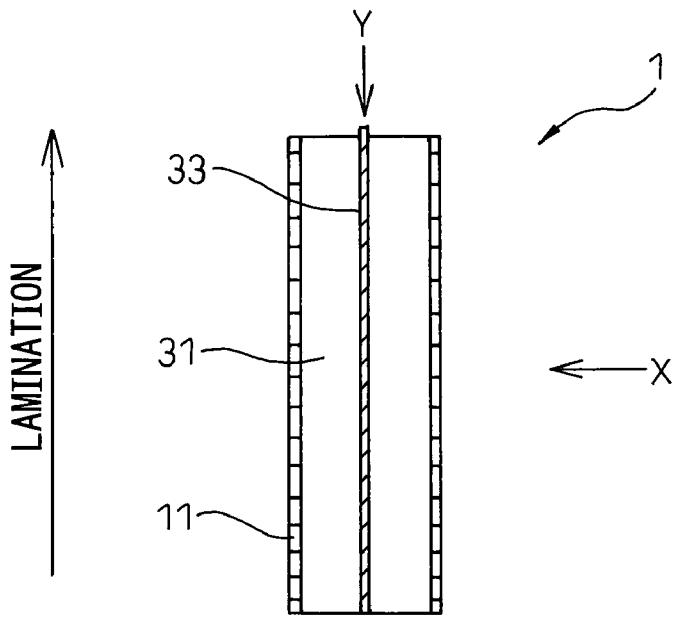
FIGS. 9A and 9B are each an explanatory drawing (2) showing the constitution of a laminated piezoelectric element according to a third embodiment of the present invention.
Figure 9B:
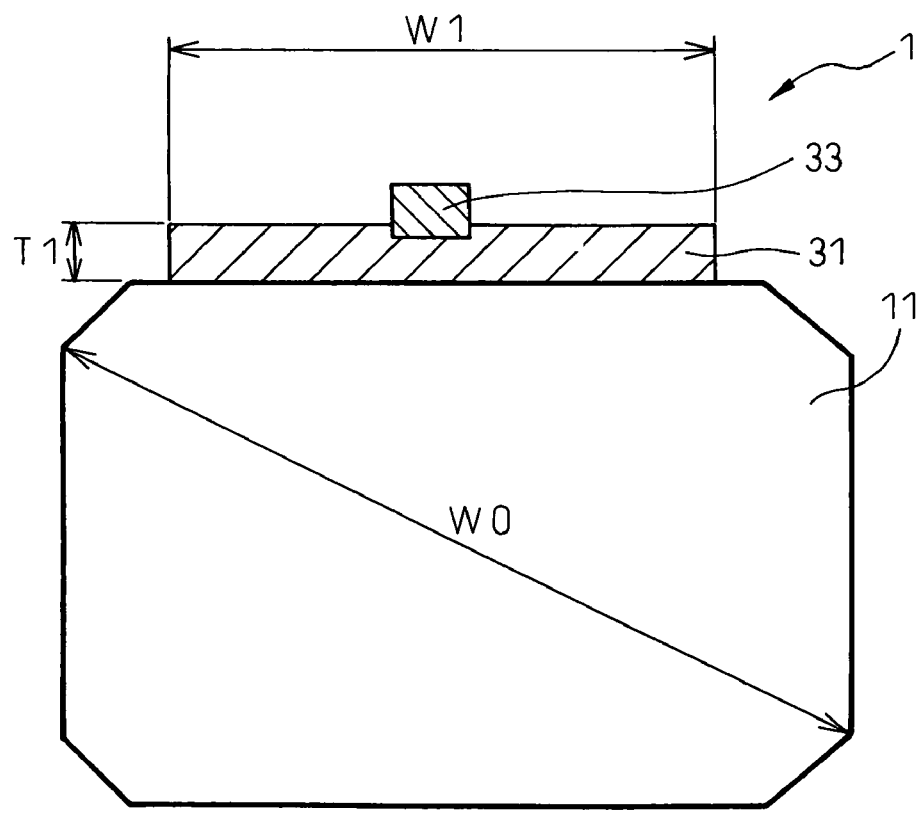

The following provides an explanation of the constitution of a third embodiment of the present invention referring to the drawings. FIGS. 9A and 9B are each an explanatory drawing showing a laminated piezoelectric element according to a third embodiment of the present invention. As shown, laminated piezoelectric element 1 of the present embodiment is provided with a first external electrode layer 31 on the outer peripheral side of a plurality of piezoelectric layers 11 composed of PZT ceramic that expands and contracts when a voltage is applied. A lead wire 33 is provided on first external electrode layer 31.

This third aspect of the present invention is characterized in that, when the maximum width of piezoelectric 11 in the direction perpendicular to the direction of lamination is taken to be W0 and the width of first external electrode layer In addition, as first external electrode layer 31 is provided continuously in the direction of lamination of piezoelectric layers 11 in piezoelectric active section 1a that expands and contracts when a voltage is applied, thermal stress applied to piezoelectric 11 from both ends of first external electrode layer 31 in the direction of lamination of piezoelectric 11 can be minimized.

In addition, the maximum width W0 of piezoelectric 11 in the direction perpendicular to the direction of lamination is 15 mm or less. As a result, width W1 of first external electrode layer 31 is 9.0 mm or less, thermal stress generated in first external electrode layer 31 does not exceed the strength of piezoelectric layers 11, and it is difficult for cracks to form in piezoelectric layers 11.

Embodiment 4

Figure 10:
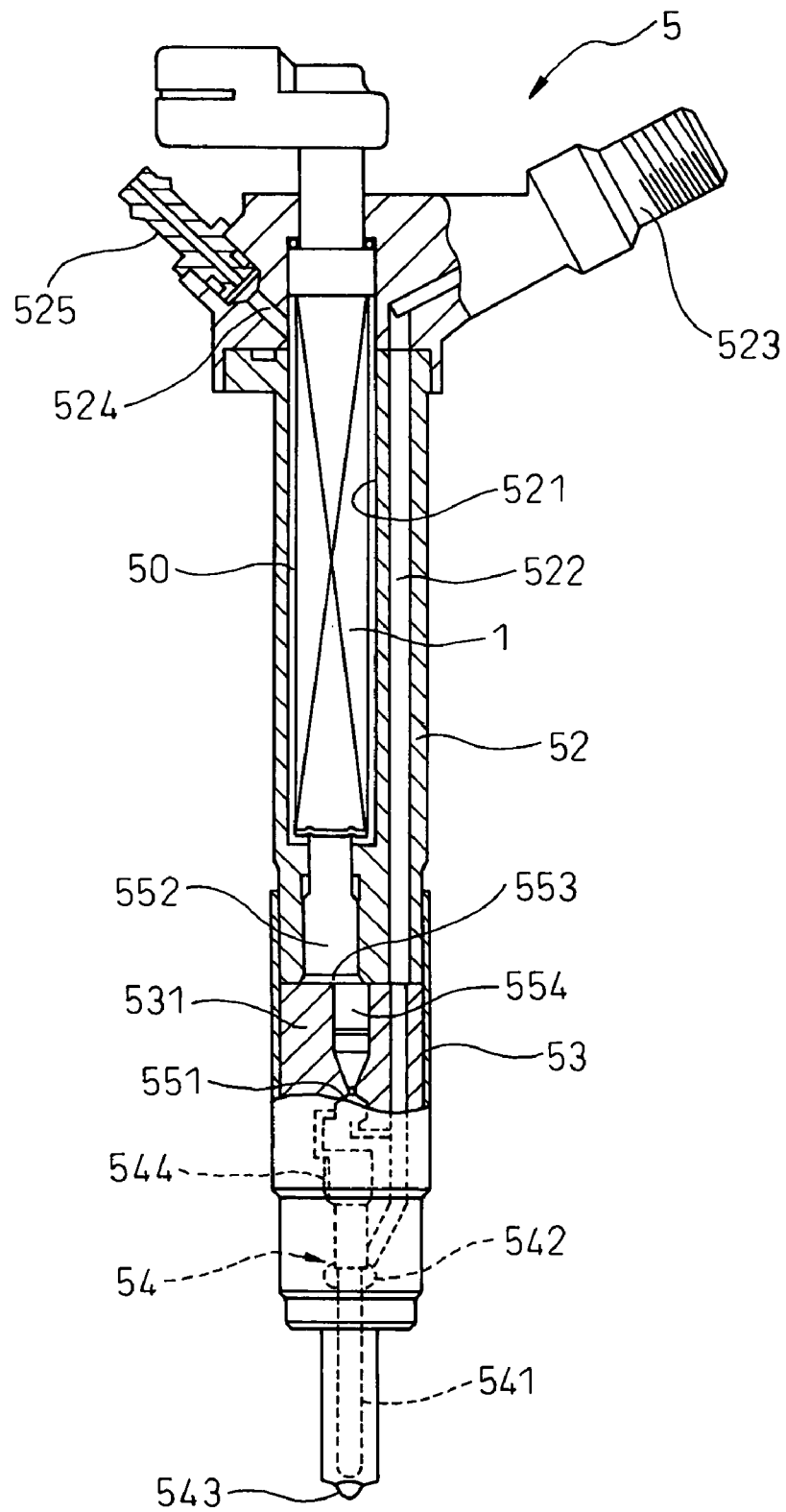
FIG. 10 is an explanatory drawing showing a constitution in which a laminated piezoelectric element according to the first to third aspects of the present invention is applied to a fuel injection apparatus.
Figure 11A:
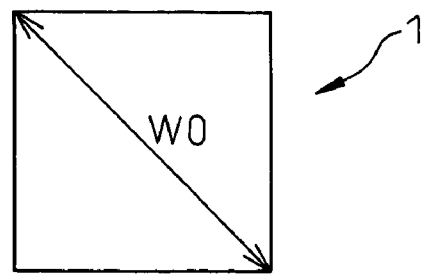
FIGS. 11A to 11D are each an explanatory drawing showing the method of defining the maximum width (W0) of a laminated piezoelectric element according to the first to third aspects of the present invention in the direction perpendicular to the direction of lamination.
Figure 11B:
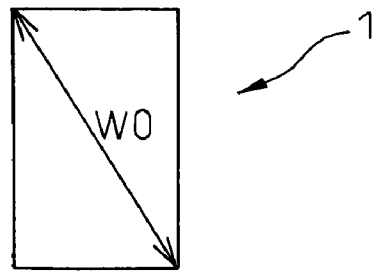
Figure 11C:
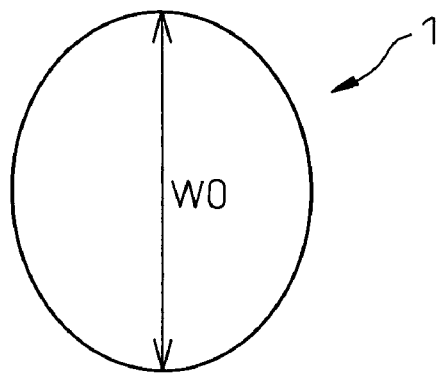
Figure 11D:
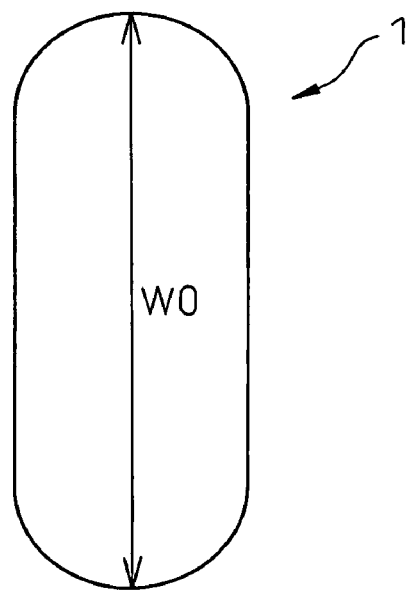

FIG. 10 is an explanatory drawing showing an example of using a laminated piezoelectric element of the present invention in a common rail fuel injection system of a diesel engine. As shown in FIG. 10, an injector 5 has an upper housing 52 that houses a drive unit in the form of the aforementioned laminated piezoelectric element 1, and a lower housing 53 fixed to its lower edge in which an injection nozzle unit 54 is formed inside.

Upper housing 52 has a roughly cylindrical shape, and laminated piezoelectric element 1 is inserted and fixed inside a longitudinal hole 521 that is eccentric with respect to the central axis. A high-pressure fuel path 522 is provided in parallel with and to the side of longitudinal hole 521, and its upper end is connected to an external common module (not shown) through fuel inlet tube 523 that protrudes from the upper side of upper housing 52.

A fuel outlet tube 525 that is continuous with a drain path 524 protrudes from the upper side of upper housing 52, and fuel that flows out from fuel outlet tube 525 is returned to a fuel tank (not shown). Drain path 524 passes through gap 50 between longitudinal hole 521 and drive unit (laminated piezoelectric element) 1, and is continuous with a three-way valve 551 to be described later by a path (not shown) that extends downward through upper and lower housings 52 and 53 from this gap 50.

An injection nozzle unit 54 is provided with a nozzle needle 541, which slides vertically in a piston body 531, and an injection port 543 that injects high-pressure fuel supplied from a fuel collector 542, which is opened and closed by nozzle needle 541, into each cylinder of the engine. Fuel collector 542 is provided around the intermediate portion of nozzle needle 541, and the lower end of the aforementioned high-pressure fuel path 522 opens herein. Nozzle needle 541 receives fuel pressure in the direction of valve opening from fuel collector 542 while also receiving fuel pressure in the direction of valve closing from back pressure chamber 544 provided facing the upper end and, when the pressure of back pressure chamber 544 drops, nozzle needle 541 lifts, injection port 543 opens and fuel is injected.

The pressure of back pressure chamber 544 is regulated by three-way valve 551. Three-way valve 551 employs a constitution that selectively connects back pressure chamber 544 with high-pressure fuel path 522 or drain path 524. Here, it has a ball-shaped valve body that opens and closes a port that connects to high-pressure fuel path 522 or drain path 524. This valve body is driven by the aforementioned drive unit 1 via a large diameter piston 552, hydraulic chamber 553 and small diameter piston 554 arranged below it.

Laminated piezoelectric element 1 for an injector of the present embodiment is characterized in that there exists a relationship among the widths of each of the external electrode layers (W1, W2 and W3) as described in the aforementioned Embodiments 1 to 3 and a relationship of the widths of the external electrode layers (W1, W2) to the maximum width (W0) of the laminated piezoelectric element in the direction perpendicular to the direction of lamination. As a result, both the securing of bonding strength between a lead wire or electrode plate connected to the external electrode layer and the external electrode layer as well as an inhibition of crack formation in the piezoelectric can be realized. Accordingly, a laminated piezoelectric element 1 for an injector can be provided that can be used in harsh environments and which is highly reliable.

Production Method:

The following provides an explanation of the production method of laminated piezoelectric element 1 and its detailed structure. A laminated piezoelectric element 1 described herein can be produced using the well-known green sheet method. A powder such as lead oxide, zirconium oxide, titanium oxide, niobium oxide or strontium carbonate serving as the primary raw material of the piezoelectric material is weighed out to the desired composition in accordance with known methods. In addition, the aforementioned mixing ratio composition is prepared to be 1 to 2% richer than the stoichiometric ratio in consideration of evaporation of lead. This is then dry mixed with a mixer followed by calcining at 800 to 950° C.

Next, pure water and a dispersant are added to form a slurry followed by wet crushing with a ball mill. After drying and degreasing this crushed powder, a solvent, a binder, a plasticizer and a dispersant, and so forth, are added followed by mixing with a ball mill. Subsequently, the slurry is vacuum degassed and its viscosity is adjusted while agitating with an agitator in a vacuum device.

Next, the slurry is molded into a green sheet of a predetermined thickness by a doctor blade device. The resulting green sheet is either stamped out with a press or cut with a cutter to mold it to a predetermined size.

Next, a pattern is screen printed on one surface of the green sheet following molding with, for example, a silver and palladium paste composed of silver and palladium at a ratio (% by weight) of 7:3 (hereinafter, referred to as Ag/Pd paste).

A pattern having a slightly smaller surface than the surface of piezoelectric layers 11 is formed over substantially the entire surface of the green sheet to serve as piezoelectric sheet 11, using the aforementioned Ag/Pd paste, to serve as internal electrode layers 21a and 21b. A section having no internal electrode layer 21a (21b) formed is provided on the other side in opposition to the surface of the green sheet. In other words, internal electrode layer 21a (21b) does not reach one end of the opposing side of the green sheet (section equivalent to side 101 or the opposing surface of laminated piezoelectric element 1), while internal electrode layer 21a (21b) does reach the other opposing end.

A predetermined number of laminated layers of green sheets, on which internal electrode layers 21a and 21b are formed in this manner, are prepared.

Next, these green sheets are then laminated. In the case of laminating green sheets on which internal electrode layers 21a and 21b are formed, they are laminated so that the sections where electrodes are not formed are alternately positioned on side 101 of laminated piezoelectric element 1 and its opposing side. As a result, internal electrode layer 21a, which is exposed by extending to green sheet side 101, serves as the internal electrode of one pole, while internal electrode layer 21b, which is exposed by reaching the opposing side, serves as the internal electrode of the other pole. As a result, the laminate has the structure shown in FIGS. 1A to 1C.

Next, after hot-pressing with a hot-water rubber press, the laminate is degreased at 400 to 700° C. with an electric furnace and then fired at a temperature of 900 to 1200° C.

Next, a silver paste for firing is screen printed onto the side of the aforementioned laminate followed by firing to form first external electrode layer 31. First external electrode layer 31 is formed at the location where internal electrode layers 21a of one of the poles are exposed and has electrical continuity with each internal electrode 21a. First external electrode 31 provided on the opposing side (not shown) is formed at the location where internal electrode layers 21b of the other pole are exposed and has electrical continuity with each internal electrode layer 21b. Furthermore, although first external electrode layer 31 is composed of silver paste for baking in this example, it can also be formed by baking a paste composed of a metal consisting of at least one selected from palladium, platinum, copper, gold, nickel, tin, lead, zinc or bismuth, or an alloy thereof. In addition, it can also be formed with solder or by coating an electrically conductive resin. Next, a second external electrode layer (32, 32b) composed of an electrically conductive resin is coated on first external electrode layer 31 (this is not required in Embodiment 3, namely in the case of a single external electrode layer). Next, a third external electrode layer 32a composed of an electrically conductive resin is coated onto second external electrode layer 32b composed of an electrically conductive resin (this step is not required in Embodiment 1, namely in the case of using two external electrode layers).

Preferably, each external electrode layer should be made of a different material. Examples of materials that should be used for first external electrode layer 31 include materials that have a small difference in coefficient of linear expansion with piezoelectric 11 such as at least one metal selected from silver, palladium, platinum, copper, gold, nickel, tin, lead, zinc and bismuth, or an alloy thereof. Solder or an epoxy-based electrically conductive resin containing silver should be used for the second external electrode layer (32, 32b). If the second external electrode layer (32, 32b) is composed of an epoxy-based electrically conductive resin containing silver, the material of the third external electrode layer 32a should be a material for which the product of its elastic modulus and coefficient of linear expansion is intermediate to that of first external electrode layer 31 and second external electrode layer 32b, such as a material composed of a silicon-modified epoxy-based electrically conductive resin containing silver. As materials having high adhesive strength typically have a large elastic modulus, considerable thermal stress is applied to piezoelectric 11. However, due to the effects of third external electrode layer 32a, a material having high adhesive strength can be used for the material of second external electrode layer 32b that bonds a lead wire or electrode plate.

Next, a lead wire 33 is bonded to the second external electrode layer (32, 32b).

Although the lead wire is typically bonded at the time of curing the second external electrode layer, bonding of the lead wire may also be carried out when curing of the third external electrode layer and second external electrode layer.

Next, laminated piezoelectric element 1 is placed in air or immersed in an insulating oil as necessary and a direct current voltage is applied via lead wire 33 between internal electrode layers 21a and 21b to polarize the piezoelectric layers 11 and obtain laminated piezoelectric element 1.

General Precautions:

The following provides an explanation of the method for defining the maximum width of the laminated piezoelectric element in the direction perpendicular to the direction of lamination (W0), and the widths of each external electrode layer (W1, W2 and W3), in the first through third aspects of the present invention referring to FIGS. 11A to 11D to FIGS. 13A to 13D.

An explanation is first provided of the method for defining the maximum width of the laminated piezoelectric element in the direction perpendicular to the direction of lamination (W0) in the first through third aspects of the present invention referring to FIGS. 11A to 11D. FIGS. 11A to 11D are cross-sectional views of laminated piezoelectric elements in the direction perpendicular to the direction of lamination. In the laminated piezoelectric element 1 shown in FIG. 11A, the shape of its cross-section is roughly square. At this time, the maximum width W0 in this cross-section is the length of the line that connects two facing corners of the square. In the laminated piezoelectric element 1 shown in FIG. 11B, the shape of its cross-section is roughly rectangular. At this time, the maximum width W0 in this cross-section is the length of the line that connects two facing corners of the rectangle. In the laminated piezoelectric element 1 shown in FIG. 11C, the shape of its cross-section is roughly an oval. At this time, the maximum width W0 in this cross-section is the length of the axial line in the lengthwise direction of the oval. In the laminated piezoelectric element 1 shown in FIG. 11D, the cross-section has two curved sections and has a shape in which the corresponding ends of the two curved sections are connected with straight lines (in the shape of a race track). At this time, the maximum width W0 in this cross-section is the length of the line that connects the corresponding apices of the two curved sections.

Furthermore, the cross-sectional shape of the laminated piezoelectric element is not limited to the shapes shown in FIGS. 11A to 11D, but rather may also be an octahedron or another polygon.

Figure 12A:
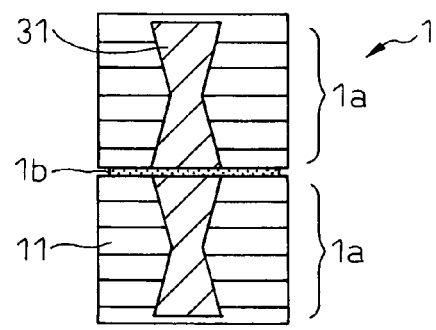
FIGS. 12A to 12C are each an explanatory drawing showing the method of defining the widths (W1, W2, W3) of external electrode layers in a laminated piezoelectric element according to the first to third aspects of the present invention.
Figure 12B:
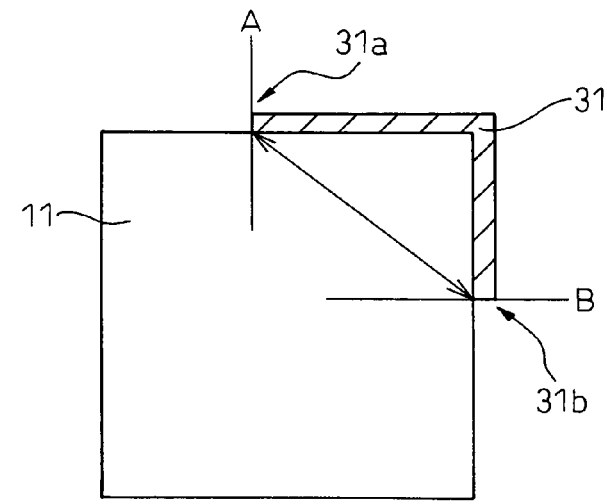
Figure 12C:
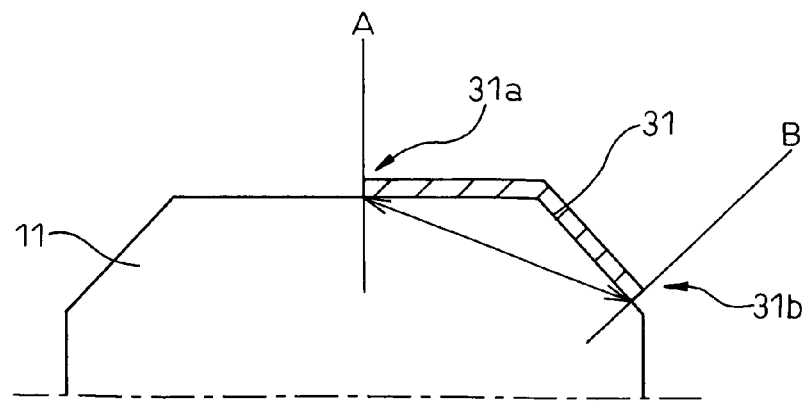

The following provides an explanation of the method for defining the widths of each external electrode layer (W1, W2 and W3) in the laminated piezoelectric elements of the first to third aspects of the present invention referring to FIGS. 12A to 12C. FIG. 12A is a side view of laminated piezoelectric element 1, FIG. 12B is a cross-sectional view of laminated piezoelectric element 1 in the direction perpendicular to the direction of lamination, and FIG. 12C is a partial cross-sectional view of laminated piezoelectric element 1 in the direction perpendicular to the direction of lamination. The widths of each external electrode layer (W1, W2, W3) are defined as the average values of the widths of each external electrode layer in piezoelectric active section 1a of laminated piezoelectric element 1. In the laminated piezoelectric element 1 shown in FIG. 12A, the width of external electrode layer 31 is not constant. At this time, the width of external electrode layer 31 is defined as the average value of the width of external electrode layer 31 at piezoelectric active section 1a of laminated piezoelectric element 1. In the laminated piezoelectric elements 1 shown in FIGS. 12B and 12C, external electrode layer 31 is provided extending across two surfaces. At this time, the width of external electrode layer 31 is defined as the average value of the minimum width between the intersecting points of normal lines A and B relative to the side of piezoelectric 11 and both ends of external electrode layer 31 (width between 31a and 31b).

As has been described above, according to the first to third aspects of the present invention, by defining the relationships between the widths of each external electrode layer (W1, W2 and W3) and the widths of the external electrode layers (W1, W2) relative to the maximum width of the laminated piezoelectric element in the direction perpendicular to the direction of lamination (W0), a laminated piezoelectric element can be provided that realizes both secure bonding strength between a lead wire or electrode plate connected to an external electrode layer and the external electrode layer as well as inhibition of crack formation in the piezoelectric.

Figure 13A:
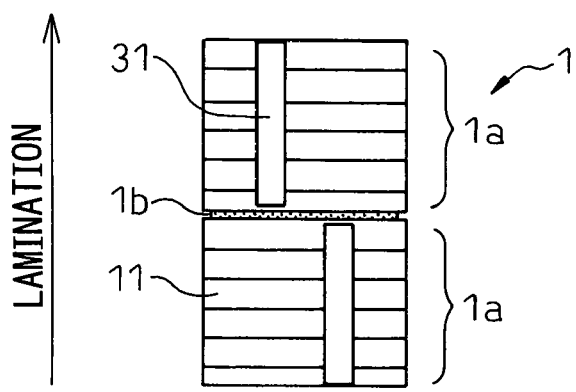
FIGS. 13A to 13D are each an explanatory drawing (1) showing other embodiments of a laminated piezoelectric element according to the first to third aspects of the present invention.
Figure 13B:
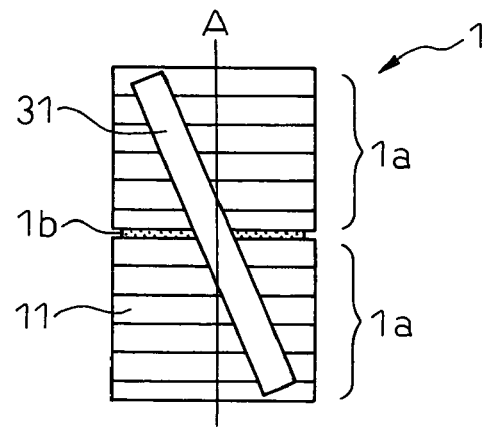
Figure 13C:
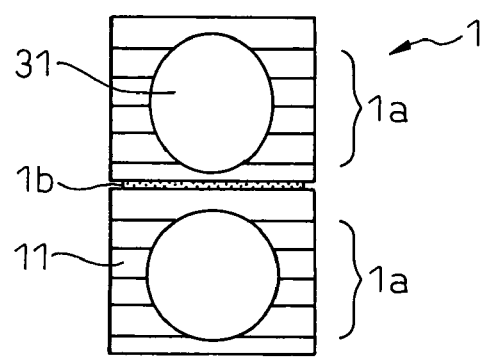
Figure 13D:
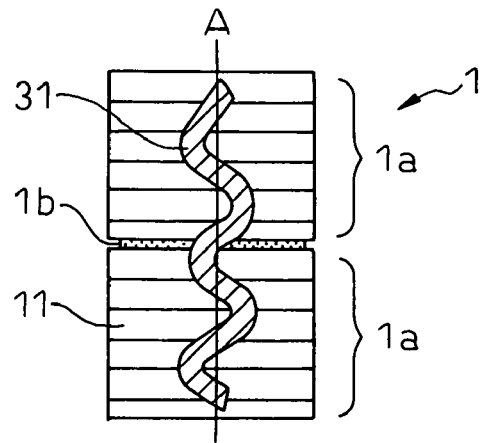
Figure 14A:
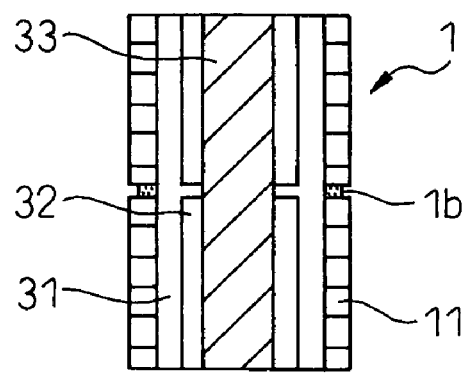
FIGS. 14A to 14D are each an explanatory drawing (2) showing other embodiments of a laminated piezoelectric element according to the first to third aspects of the present invention.
Figure 14B:
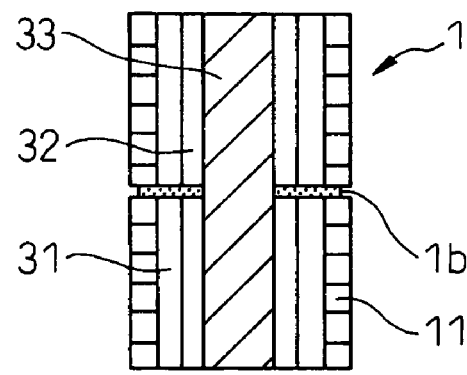
Figure 14C:
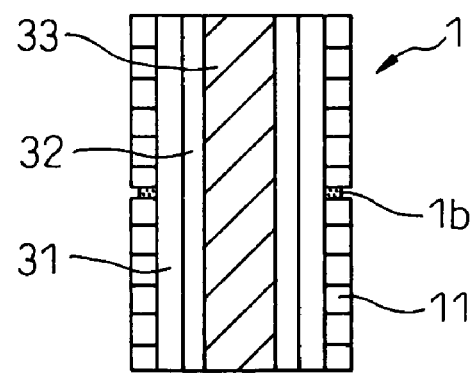
Figure 14D:
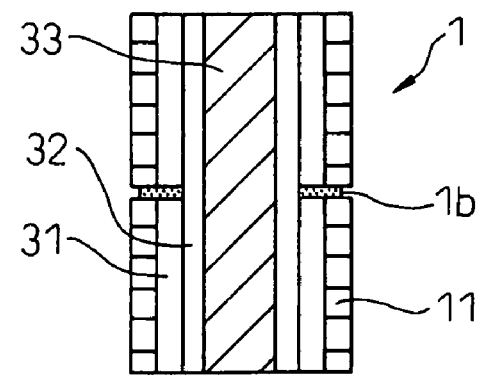
Figure 15A:
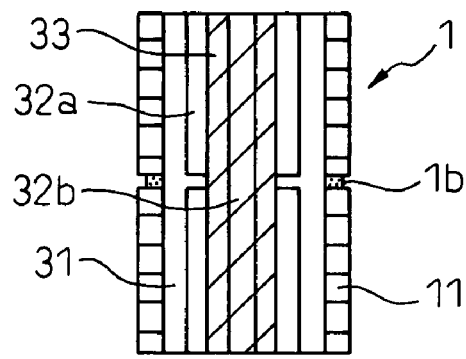
FIGS. 15A to 15D are each an explanatory drawing (3) showing other embodiments of a laminated piezoelectric element according to the first to third aspects of the present invention.
Figure 15B:
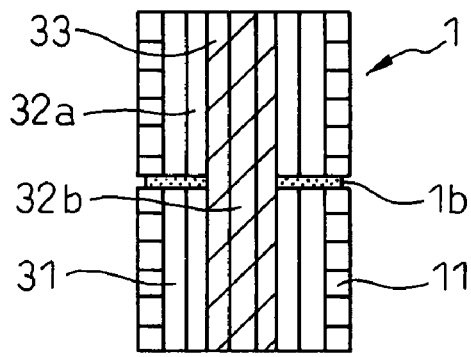
Figure 15C:
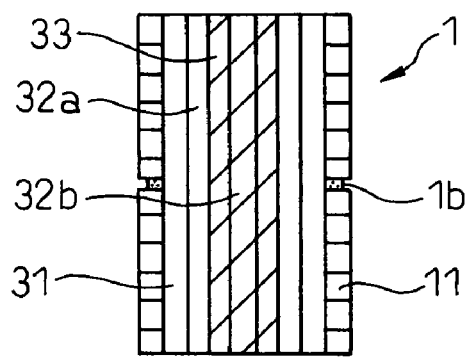
Figure 15D:
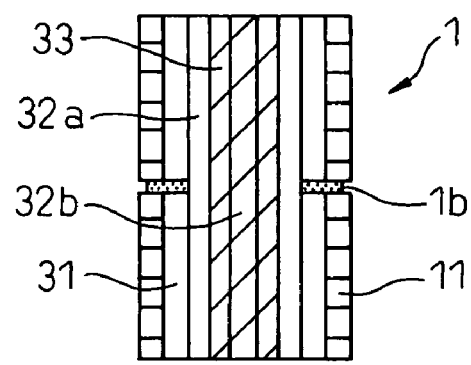
Figure 16A:
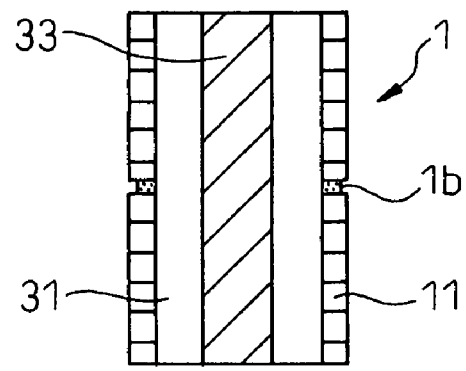
FIGS. 16A to 16D are each an explanatory drawing (4) showing other embodiments of a laminated piezoelectric element according to the first to third aspects of the present invention.
Figure 16B:
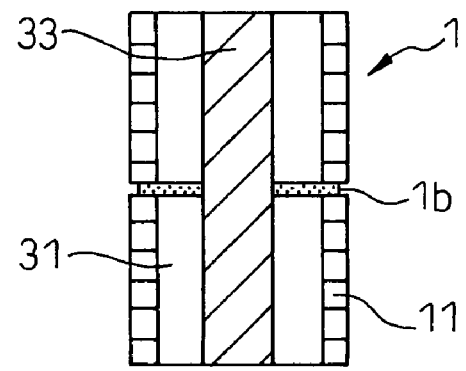
Figure 16C:
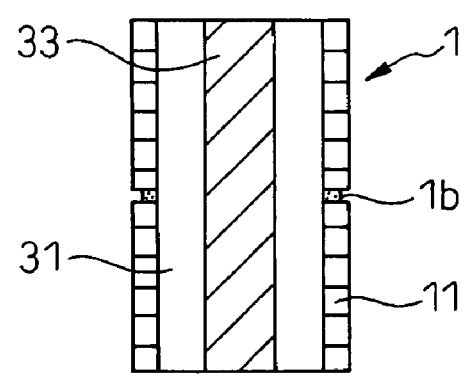
Figure 16D:
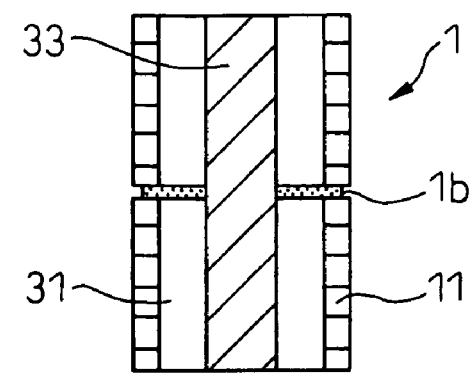
Figure 17A:
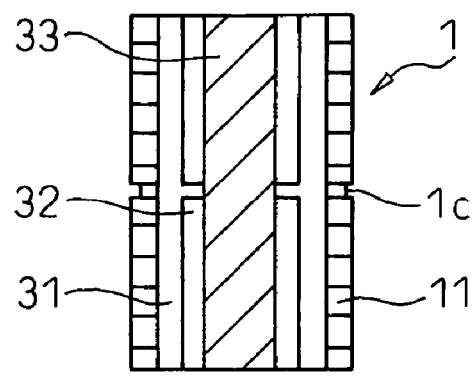
FIGS. 17A to 17D are each an explanatory drawing (5) showing other embodiments of a laminated piezoelectric element according to the first to third aspects of the present invention.
Figure 17B:
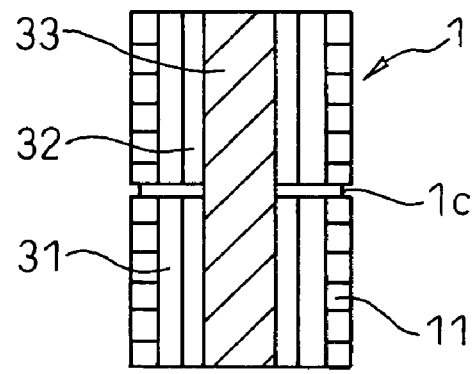
Figure 17C:
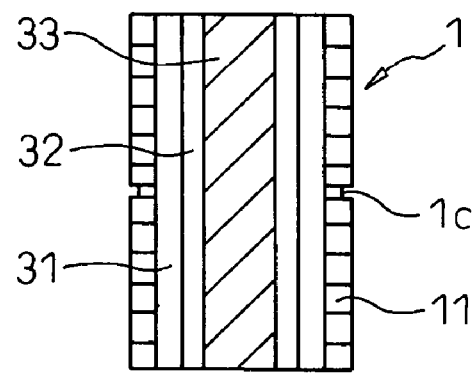
Figure 17D:
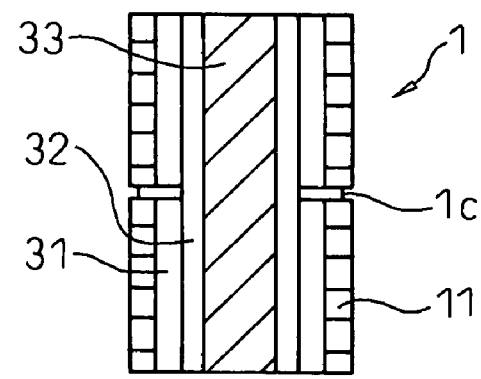

Furthermore, the constitution applied to the present invention is not limited to the constitutions of the above-described embodiments provided the object of the present invention is able to be achieved. For example, the shape of each piezoelectric layer 11 is not limited to a quadrangle, but rather may also be a octagon or other polygon. In addition, the external electrode layers may formed by screen printing, deposition, mask-coating using a metal mask or coating with a dispenser. In addition, the materials of the external electrode layers may all be the same. In addition, the shape of the external electrode layers may be suitably changed, and as shown in FIG. 13A for example, external electrode layer 31, which is provided continuously on the outer peripheral side of laminated piezoelectric element 1 in the direction of lamination of piezoelectric 11 at a piezoelectric active section that expands and contracts when a voltage is applied, may be separated at bonding surface 1b of the piezoelectric units, while the separated external electrode layer 31 may be provided mutually differently offset in the direction orthogonal to the direction of lamination of piezoelectric 11. In addition, as shown in FIG. 13B, an external electrode layer 31 may also be provided diagonally relative to axial line A in the direction of lamination of piezoelectric layers 11 on the outer peripheral side of laminated piezoelectric element 1. In addition, as shown in FIG. 13D, external electrode layer 31 may also be provided in a corrugated manner relative to axial line A in the direction of lamination of piezoelectric layers 11 on the outer peripheral side of laminated piezoelectric element 1. In addition, as shown in FIG. 13C, an external electrode layer 31 may also be provided in the shape of a circle. In addition, the electrode that supplies a voltage from an external power supply to an external electrode layer is not limited to a lead wire, but rather may also be a plate-like electrode 33 in the shape of a plate and having a plurality of openings as shown in FIGS. 14A to 14D to FIGS. 16A to 16D. In addition, laminated piezoelectric element 1 may also be in the form of a laminated piezoelectric element in which indentations are provided in the side of piezoelectric layers 11, to alleviate an internal stress caused by operation of laminated piezoelectric element 1, as shown in FIGS. 17A to 17D.

The invention claimed is:

1. A laminated piezoelectric element comprising:
   a laminated piezoelectric element comprising piezoelectric layers composed of a ceramic capable of expanding and contracting upon application of a voltage, and internal electrode layers that supply voltage to the piezoelectric layers, the internal electrode layers and piezoelectric layers being alternately provided;
   a first external electrode layer provided on a side of the laminated piezoelectric element and electrically connected with the internal electrode layers; and,
   a second external electrode layer provided on a side of the laminated piezoelectric element and electrically connected with the internal electrode layers via the first external electrode layer; wherein,
   when the maximum width of the laminated piezoelectric element in the direction perpendicular to the direction of lamination is taken to be W0, the width of the first external electrode layer is taken to be W1, and the width of the second external electrode layer is taken to be W2, the relationship exists in which W1>W2 and $2.5 \leq (W2/W0) \times 100 \leq 60$, and
   the laminated piezoelectric element has a piezoelectric active section that expands and contracts when a voltage is applied, and the second external electrode layer is provided continuously in the direction of lamination of the piezoelectric layers in the piezoelectric active section.

2. The laminated piezoelectric element according to claim 1 wherein, when the maximum width of the laminated piezoelectric element in the direction perpendicular to the direction of lamination is taken to be W0 and the width of the second external electrode layer is taken to be W2, a relationship exists in which $5 \leq (W2/W0) \times 100 \leq 30$.

3. The laminated piezoelectric element according to claim 1 wherein, when the thickness (after curing) of the first external electrode layer is taken to be T1 and the thickness (after curing) of the second external electrode layer is taken to be T2, a relationship exists in which $0.05 \leq (T2/T1) \leq 300$.

4. The laminated piezoelectric element according to claim 1 wherein, when the thickness (after curing) of the first external electrode layer is taken to be T1 and the thickness (after curing) of the second electrode layer is taken to be T2, a relationship exists in which $1 \leq (T2/T1) \leq 35$.

5. The laminated piezoelectric element according to claim 1 wherein, when the maximum width of the laminated piezoelectric element in the direction perpendicular to the direction of lamination is taken to be W0, a relationship exists in which $W0 \leq 15$ mm.

6. The laminated piezoelectric element according to claim 1 wherein the first external electrode layer comprises a metal consisting of at least one among silver, palladium, platinum, copper, gold, nickel, tin, lead, zinc and bismuth, or an alloy thereof.

7. The laminated piezoelectric element according to claim 1 wherein, the second external electrode layer comprises solder or an electrically conductive resin material.

8. A laminated piezoelectric element comprising:
   a laminated piezoelectric element comprising piezoelectric layers composed of a ceramic capable of expanding and contracting upon application of a voltage, and internal electrode layers that supply voltage to the piezoelectric layers the internal electrode layers and piezoelectric layers being alternately provided;
   a first external electrode layer provided on a side of the laminated piezoelectric element and electrically connected with the internal electrode layers;
   a second external electrode layer provided on a side of the laminated piezoelectric element and electrically connected with the internal electrode layers via the first external electrode layer; and,
   a third external electrode layer provided on a side of the laminated piezoelectric element and provided between the first external electrode layer and the second external electrode layer; wherein,
   when the maximum width of the laminated piezoelectric element in the direction perpendicular to the direction of lamination is taken to be W0, the width of the first external electrode layer is taken to be W1, the width of the second external electrode layer is taken to be W2, the width of the third external electrode layer is taken to be W3, the thickness (after curing) of the second electrode layer is taken to be T2, and the thickness (after curing) of the third external electrode layer is taken to be T3, a relationship exists in which W1>W3>W2, $2.5 \leq (W2/W0) \times 100 \leq 60$, and $0.05 \leq (T2/T3) \leq 300$; and,
   the laminated piezoelectric element has a piezoelectric active section that expands and contracts when a voltage is applied, and the second external electrode layer is provided continuously in the direction of lamination of the piezoelectric layers in the piezoelectric active section.

9. The laminated piezoelectric element according to claim 8 wherein, when the maximum width of the laminated piezoelectric element in the direction perpendicular to the direction of lamination is taken to be W0, the width of the second external electrode layer is taken to be W2, the thickness (after curing) of the second external electrode layer is taken to be T2, and the thickness (after curing) of the third external electrode layer is taken to be T3, a relationship exists in which $5 \leq (W2/W0) \times 100 \leq 30$, and $1 \leq (T2/T3) \leq 35$.

10. The laminated piezoelectric element according to claim 8 wherein the materials of first external electrode layer, the second external electrode layer, and the third external electrode layer are all different materials.

11. The laminated piezoelectric element according to claim 8 wherein, when the coefficient of linear expansion of the first external electrode layer is taken to be $\alpha1$, the coefficient of linear expansion of the second external electrode layer is taken to be $\alpha2$, the coefficient of linear expansion of the third external electrode layer is taken to be $\alpha3$, the elastic modulus of the first external electrode layer is taken to be E1, the elastic modulus of the second external electrode layer is taken to be E2, and the elastic modulus of the third external electrode layer is taken to be E3, $E1 \times \alpha1 < E3 \times \alpha3 < E2 \times \alpha2$.

12. The laminated piezoelectric element according to claim 8 wherein, when the maximum width of the laminated piezoelectric element in the direction perpendicular to the direction of lamination is taken to be W0, $W0 \leq 15$ mm.

13. The laminated piezoelectric element according to claim 8 wherein the first external electrode layer comprises a metal consisting of at least one among silver, palladium, platinum, copper, gold, nickel, tin, lead, zinc and bismuth, or an alloy thereof.

14. The laminated piezoelectric element according to claim 8 wherein the second external electrode layer and the third external electrode layer comprise solder or an electrically conductive resin material.

15. A laminated piezoelectric element comprising:
a laminated piezoelectric element comprising piezoelectric layers composed of a ceramic capable of expanding and contracting upon application of a voltage, and internal electrode layers that supply voltage to the piezoelectric layers, the internal electrode layers and piezoelectric layers being alternately provided; and,
a first external electrode layer provided on a side of the laminated piezoelectric element and electrically connected with the internal electrode layers; wherein,
when the maximum width of the laminated piezoelectric element in the direction perpendicular to the direction of lamination is taken to be W0, and the width of the first external electrode layer is taken to be W1, the relationship exists in which $2.5 \leq (W1/W0) \times 100 \leq 60$; and,
the laminated piezoelectric element has a piezoelectric active section that expands and contracts when a voltage is applied, and the first external electrode layer is provided continuously in the direction of lamination of the piezoelectric layers in the piezoelectric active section.

16. The laminated piezoelectric element according to claim 15 wherein, when the maximum width of the laminated piezoelectric element in the direction perpendicular to the direction of lamination is taken to be W0, and the width of the first external electrode layer is taken to be W1, a relationship exists in which $5 \leq (W1/W0) \times 100 \leq 30$.

17. The laminated piezoelectric element according to claim 15 wherein, when the maximum width of the laminated piezoelectric element in the direction perpendicular to the direction of lamination is taken to be W0, $W0 \leq 15$ mm.

18. The laminated piezoelectric element according to claim 15 wherein the first external electrode layer comprises a metal consisting of at least one among silver, palladium, platinum, copper, gold, nickel, tin, lead, zinc and bismuth, or an alloy thereof.

19. The laminated piezoelectric element according to claim 15 wherein the first external electrode layer comprises solder or an electrically conductive resin material.

20. The laminated piezoelectric element according to claim 1, that is used in a fuel injection apparatus.

* * * * *